(12) United States Patent

Azam et al.

(10) Patent No.: US 12,562,745 B2

(45) Date of Patent: Feb. 24, 2026

(54) APPARATUS, SYSTEM, AND METHOD OF A DIGITALLY-CONTROLLED FREQUENCY MULTIPLIER

(71) Applicant: Intel Corporation, Santa Clara, CA (US)

(72) Inventors: Ali Azam, Hillsboro, OR (US); Ashoke Ravi, Portland, OR (US); Ofir Degani, Nes-Ammin (IL)

(73) Assignee: INTEL CORPORATION, Santa Clara, CA (US)

( * ) Notice: Subject to any disclaimer, the term of this patent is extended or adjusted under 35 U.S.C. 154(b) by 739 days.

(21) Appl. No.: 17/842,585

(22) Filed: Jun. 16, 2022

(65) Prior Publication Data

US 2022/0329248 A1 Oct. 13, 2022

(51) Int. Cl.
| | |
|---|---|
| *H03L 7/197* | (2006.01) |
| *H03L 7/081* | (2006.01) |
| *H03L 7/091* | (2006.01) |
| *H03L 7/093* | (2006.01) |

(52) U.S. Cl.
CPC .......... *H03L 7/1978* (2013.01); *H03L 7/0814* (2013.01); *H03L 7/091* (2013.01); *H03L 7/093* (2013.01)

(58) Field of Classification Search
CPC ....... H03L 7/0814; H03L 7/091; H03L 7/093; H03L 7/1978; H03L 7/22
See application file for complete search history.

(56) References Cited

U.S. PATENT DOCUMENTS

| | | | | |
|---|---|---|---|---|
| 5,764,111 A | * | 6/1998 | Bushman ................. | H03L 7/16 |
| | | | | 331/60 |
| 6,005,443 A | * | 12/1999 | Damgaard ............. | H03J 5/242 |
| | | | | 331/25 |
| 6,633,190 B1 | * | 10/2003 | Alvandpour .......... | H03L 7/0814 |
| | | | | 327/158 |
| 7,276,978 B2 | * | 10/2007 | Puma .................... | H03L 7/1976 |
| | | | | 331/25 |

(Continued)

FOREIGN PATENT DOCUMENTS

| | | | | |
|---|---|---|---|---|
| CN | 107846217 A | * | 3/2018 | ........... H03L 7/0898 |
| CN | 109412587 A | * | 3/2019 | ............. H03L 7/093 |

(Continued)

*Primary Examiner* — Berhanu Tadese
(74) *Attorney, Agent, or Firm* — Shichrur & Co.

(57) ABSTRACT

For example, an apparatus may include a digitally-controlled frequency multiplier, which may be controllable according to a digital control input, to generate an output frequency signal having an output frequency, for example, by multiplying an input frequency of an input frequency signal. For example, the digitally-controlled frequency multiplier may include a phase generator configured to generate a plurality of phase-shifted signal groups corresponding to a respective plurality of first phase-shifts applied to the input frequency signal, a plurality of digital clock multipliers controllable according to the digital control input to generate a respective plurality of frequency-multiplied signals based on the plurality of phase-shifted signal groups, and a combiner to generate the output frequency signal based on a combination of the plurality of frequency-multiplied signals.

25 Claims, 13 Drawing Sheets

(56) References Cited

U.S. PATENT DOCUMENTS

| | | | | |
|---|---|---|---|---|
| 7,398,341 | B1 * | 7/2008 | Gaither | H04L 25/0298 |
| | | | | 710/63 |
| 7,492,850 | B2 * | 2/2009 | Menolfi | H03D 3/006 |
| | | | | 455/208 |
| 7,525,393 | B2 * | 4/2009 | Ngo | H03L 7/093 |
| | | | | 331/25 |
| 7,622,966 | B2 * | 11/2009 | Werker | H03L 7/22 |
| | | | | 327/147 |
| 7,633,322 | B1 * | 12/2009 | Zhuang | H03L 7/18 |
| | | | | 327/147 |
| 7,656,323 | B2 * | 2/2010 | Bereza | H03L 7/0991 |
| | | | | 370/537 |
| 7,685,340 | B1 * | 3/2010 | Gaither | H04L 25/0278 |
| | | | | 710/63 |
| 7,724,862 | B2 * | 5/2010 | Menolfi | H03L 7/093 |
| | | | | 455/208 |
| 7,729,445 | B2 * | 6/2010 | Ravi | H04L 27/368 |
| | | | | 375/297 |
| 7,876,164 | B2 * | 1/2011 | Imenes | H03L 7/20 |
| | | | | 331/25 |
| 8,311,176 | B2 * | 11/2012 | Lee | H04L 7/0008 |
| | | | | 327/147 |
| 8,878,577 | B2 * | 11/2014 | Waltari | H03M 1/0626 |
| | | | | 327/147 |
| 8,917,124 | B1 * | 12/2014 | Waltari | H03L 7/18 |
| | | | | 327/147 |
| 8,957,796 | B2 * | 2/2015 | Waltari | H03L 7/093 |
| | | | | 341/120 |
| 9,007,108 | B1 * | 4/2015 | Waltari | H03M 1/12 |
| | | | | 327/158 |
| 9,137,084 | B2 * | 9/2015 | Degani | H04L 27/36 |
| 9,306,585 | B1 * | 4/2016 | Elkholy | H03L 7/0814 |
| 9,608,641 | B2 * | 3/2017 | Van Den Heuvel | H03L 7/0814 |
| 9,893,876 | B2 * | 2/2018 | Moehlmann | H04L 7/0331 |
| 9,966,937 | B2 * | 5/2018 | Yayla | H03K 5/00006 |
| 9,985,618 | B2 * | 5/2018 | Park | H03L 7/093 |
| 10,097,187 | B2 * | 10/2018 | Doare | H03L 7/0814 |
| 10,230,380 | B2 * | 3/2019 | Pake Talei | H03L 7/0991 |
| 10,516,400 | B2 * | 12/2019 | Huh | H03L 7/0992 |
| 10,727,848 | B2 * | 7/2020 | Dato | H03L 7/0992 |
| 10,944,405 | B2 * | 3/2021 | Huh | H03L 7/0802 |
| 11,206,027 | B2 * | 12/2021 | Pahkala | H03L 7/0991 |
| 11,588,489 | B1 * | 2/2023 | Gupta | H03L 7/0992 |
| 11,909,403 | B2 * | 2/2024 | Shen | H03L 7/0818 |
| 12,078,747 | B2 * | 9/2024 | Kushnir | G01S 13/536 |
| 2006/0202768 | A1 * | 9/2006 | Puma | H03L 7/081 |
| | | | | 331/16 |
| 2007/0047689 | A1 * | 3/2007 | Menolfi | H03D 3/006 |
| | | | | 375/376 |
| 2008/0075194 | A1 * | 3/2008 | Ravi | H03F 1/0294 |
| | | | | 375/297 |
| 2008/0266000 | A1 * | 10/2008 | Ngo | H03L 7/18 |
| | | | | 331/25 |
| 2008/0292040 | A1 * | 11/2008 | Menolfi | H03L 7/085 |
| | | | | 375/376 |
| 2008/0298476 | A1 * | 12/2008 | Bereza | H03K 5/133 |
| | | | | 375/257 |
| 2009/0115534 | A1 * | 5/2009 | Imenes | H03L 7/20 |
| | | | | 331/17 |
| 2009/0267664 | A1 * | 10/2009 | Uozumi | H03L 7/193 |
| | | | | 327/158 |
| 2010/0090732 | A1 * | 4/2010 | Lee | H03L 7/093 |
| | | | | 327/156 |
| 2012/0002707 | A1 * | 1/2012 | Yamasaki | H03L 7/099 |
| | | | | 327/156 |
| 2013/0136220 | A1 * | 5/2013 | Lee | H04L 7/0008 |
| | | | | 375/375 |
| 2014/0070859 | A1 * | 3/2014 | Waltari | H03L 7/091 |
| | | | | 327/158 |
| 2016/0373094 | A1 * | 12/2016 | Yayla | H03B 19/14 |
| 2017/0019115 | A1 * | 1/2017 | Van Den Heuvel | H03L 7/093 |
| 2017/0187364 | A1 * | 6/2017 | Park | H03L 7/093 |
| 2018/0062662 | A1 * | 3/2018 | Pake Talei | H03L 7/0991 |
| 2018/0123537 | A1 * | 5/2018 | Salle | H03L 7/08 |
| 2018/0145692 | A1 * | 5/2018 | Doare | H03L 1/00 |
| 2022/0057480 | A1 * | 2/2022 | Kushnir | G01S 7/35 |
| 2022/0329248 | A1 * | 10/2022 | Azam | H03L 7/1978 |
| 2024/0283459 | A1 * | 8/2024 | Wulff | H03L 7/099 |

FOREIGN PATENT DOCUMENTS

| | | | | | |
|---|---|---|---|---|---|
| CN | 107846217 | B | * | 5/2021 | H03L 7/0898 |
| DE | 19849779 | A1 | * | 11/1999 | H03L 7/181 |
| EP | 0944172 | A2 | * | 9/1999 | H03L 7/185 |
| EP | 1330034 | A2 | * | 7/2003 | H03L 7/087 |
| EP | 2011229 | B1 | * | 4/2010 | H03L 7/091 |
| EP | 3119000 | A1 | * | 1/2017 | H03L 7/0814 |
| EP | 3119000 | B1 | * | 3/2018 | H03L 7/091 |
| EP | 3327461 | A1 | * | 5/2018 | H03L 7/091 |
| EP | 3327461 | B1 | * | 11/2020 | H03C 3/0933 |
| EP | 3912270 | B1 | * | 8/2024 | H03L 7/22 |
| JP | H08265111 | A | * | 10/1996 | H03L 7/0991 |
| JP | 3986572 | B2 | * | 10/2007 | H03L 7/0991 |
| JP | 2009188699 | A | * | 8/2009 | H03L 7/08 |
| JP | WO2009044444 | A1 | * | 1/2011 | H03L 7/0991 |
| JP | 5290589 | B2 | * | 9/2013 | H03L 7/085 |
| KR | 19990086994 | A | * | 12/1999 | H03K 3/027 |
| KR | 100305493 | B1 | * | 10/2001 | H03K 3/86 |
| KR | 20090086155 | A | * | 8/2009 | H03L 7/085 |
| KR | 101630872 | B1 | * | 6/2016 | H03L 7/093 |
| KR | 101959789 | B1 | * | 3/2019 | H03L 7/189 |
| KR | 20210106881 | A | * | 8/2021 | H03B 19/14 |
| NO | 324467 | B1 | * | 10/2007 | H03L 7/091 |
| WO | WO-9836491 | A1 | * | 8/1998 | H03L 7/16 |
| WO | WO-2007114705 | A1 | * | 10/2007 | H03L 7/091 |
| WO | WO-2008045167 | A1 | * | 4/2008 | H03L 7/0807 |
| WO | WO-2009044444 | A1 | * | 4/2009 | H03L 7/093 |
| WO | WO-2016032667 | A1 | * | 3/2016 | H03L 7/146 |
| WO | WO-2017112222 | A1 | * | 6/2017 | H04L 7/0332 |
| WO | WO-2020185213 | A1 | * | 9/2020 | G01S 13/536 |

* cited by examiner

700

APPARATUS, SYSTEM, AND METHOD OF A DIGITALLY-CONTROLLED FREQUENCY MULTIPLIER

TECHNICAL FIELD

Aspects described herein generally relate to a digitally-controlled frequency multiplier.

BACKGROUND

Some devices, for example, radar devices and/or wireless communication devices, may include a plurality of Physical Layer (PHY) chains, which may communicate Radio Frequency (RF) signals via a plurality of antennas.

The PHY chains may include one or more elements and/or complements, which may be operated based on a frequency signal, e.g., a Local oscillator (LO) signal.

BRIEF DESCRIPTION OF THE DRAWINGS

For simplicity and clarity of illustration, elements shown in the figures have not necessarily been drawn to scale. For example, the dimensions of some of the elements may be exaggerated relative to other elements for clarity of presentation. Furthermore, reference numerals may be repeated among the figures to indicate corresponding or analogous elements. The figures are listed below.

DETAILED DESCRIPTION

Figure 1:
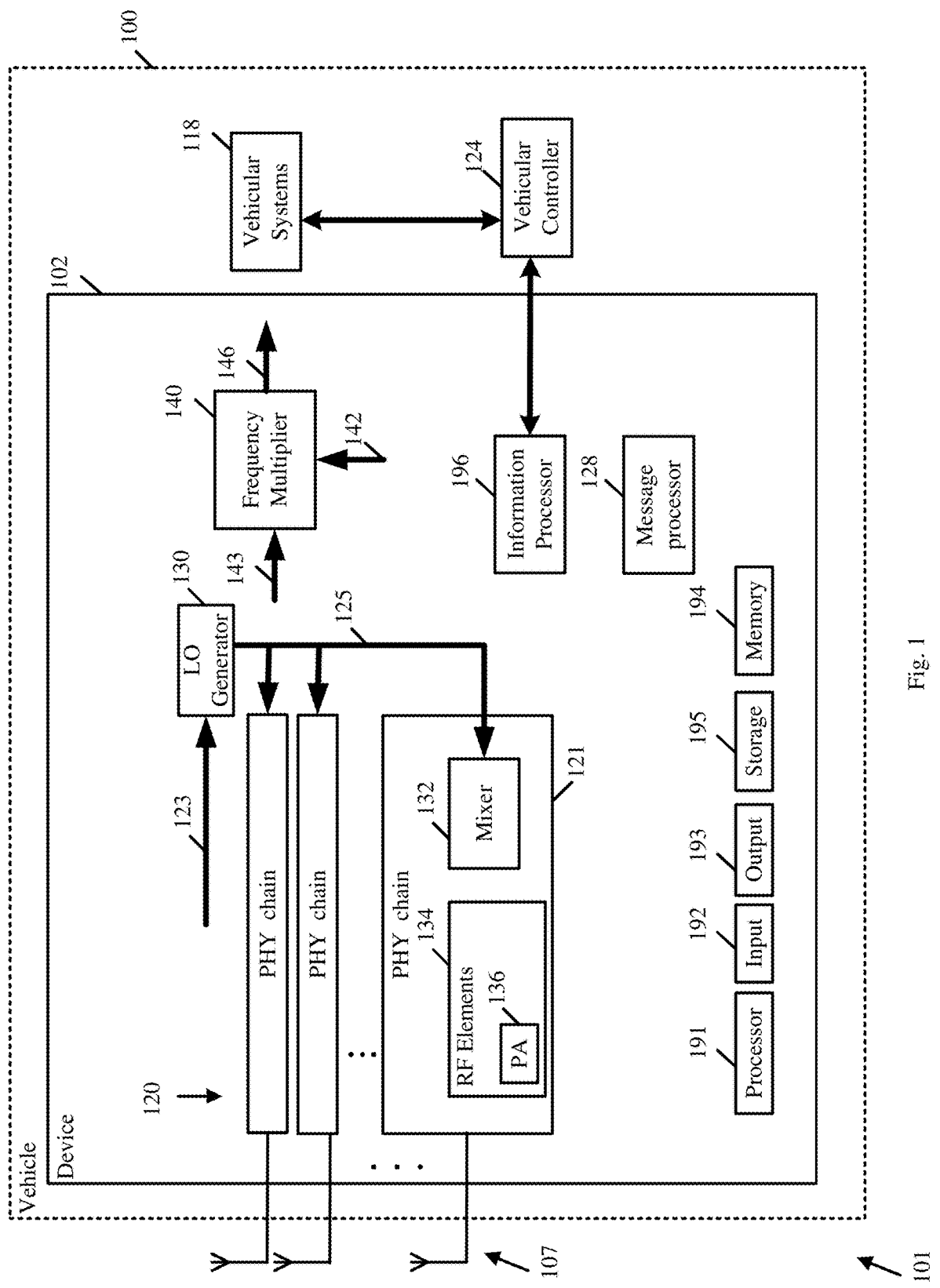
FIG. 1 is a schematic block diagram illustration of a system, in accordance with some demonstrative aspects.

In the following detailed description, numerous specific details are set forth in order to provide a thorough understanding of some aspects. However, it will be understood by persons of ordinary skill in the art that some aspects may be practiced without these specific details. In other instances, well-known methods, procedures, components, units and/or circuits have not been described in detail so as not to obscure the discussion.

Discussions herein utilizing terms such as, for example, "processing", "computing", "calculating", "determining", "establishing", "analyzing", "checking", or the like, may refer to operation(s) and/or process(es) of a computer, a computing platform, a computing system, or other electronic computing device, that manipulate and/or transform data represented as physical (e.g., electronic) quantities within the computer's registers and/or memories into other data similarly represented as physical quantities within the computer's registers and/or memories or other information storage medium that may store instructions to perform operations and/or processes.

The terms "plurality" and "a plurality", as used herein, include, for example, "multiple" or "two or more". For example, "a plurality of items" includes two or more items.

The words "exemplary" and "demonstrative" are used herein to mean "serving as an example, instance, demonstration, or illustration". Any aspect, aspect, or design described herein as "exemplary" or "demonstrative" is not necessarily to be construed as preferred or advantageous over other aspects, aspects, or designs.

References to "one aspect", "an aspect", "demonstrative aspect", "various aspects" etc., indicate that the aspect(s) so described may include a particular feature, structure, or characteristic, but not every aspect necessarily includes the particular feature, structure, or characteristic. Further, repeated use of the phrase "in one aspect" does not necessarily refer to the same aspect, although it may.

As used herein, unless otherwise specified the use of the ordinal adjectives "first", "second", "third" etc., to describe a common object, merely indicate that different instances of like objects are being referred to, and are not intended to imply that the objects so described must be in a given sequence, either temporally, spatially, in ranking, or in any other manner.

The phrases "at least one" and "one or more" may be understood to include a numerical quantity greater than or equal to one, e.g., one, two, three, four, [ . . . ], etc. The phrase "at least one of" with regard to a group of elements may be used herein to mean at least one element from the group consisting of the elements. For example, the phrase "at least one of" with regard to a group of elements may be used herein to mean one of the listed elements, a plurality of one of the listed elements, a plurality of individual listed elements, or a plurality of a multiple of individual listed elements.

The term "data" as used herein may be understood to include information in any suitable analog or digital form, e.g., provided as a file, a portion of a file, a set of files, a signal or stream, a portion of a signal or stream, a set of signals or streams, and the like. Further, the term "data" may also be used to mean a reference to information, e.g., in form of a pointer. The term "data", however, is not limited to the aforementioned examples and may take various forms and/or may represent any information as understood in the art.

Some aspects may be used in conjunction with various devices and systems, for example, a radar sensor, a radar device, a radar system, a vehicle, a vehicular system, an autonomous vehicular system, a vehicular communication system, a vehicular device, a sensor device, a wireless communication device, a User Equipment (UE), a Mobile Device (MD), a wireless station (STA), a Personal Computer (PC), a desktop computer, a mobile computer, a laptop computer, a notebook computer, a tablet computer, a hand-held computer, a sensor device, an Internet of Things (IoT) device, a wearable device, a handheld device, a Personal Digital Assistant (PDA) device, a handheld PDA device, a non-vehicular device, a mobile or portable device, a con-sumer device, a non-mobile or non-portable device, a wire-less communication station, a wireless Access Point (AP), a wired or wireless router, a wired or wireless modem, a video device, an audio device, an audio-video (A/V) device, a wired or wireless network, a wireless area network, a Wireless Video Area Network (WVAN), a Local Area Net-work (LAN), a Wireless LAN (WLAN), a Personal Area Network (PAN), a Wireless PAN (WPAN), and the like.

Some aspects may be used in conjunction with one way and/or two-way radio communication systems, cellular radio-telephone communication systems, a mobile phone, a cellular telephone, a wireless telephone, a Personal Com-munication Systems (PCS) device, a PDA device which incorporates a wireless communication device, a mobile or portable Global Positioning System (GPS) device, a device which incorporates a GPS receiver or transceiver or chip, a device which incorporates an RFID element or chip, a Multiple Input Multiple Output (MIMO) transceiver or device, a Single Input Multiple Output (SIMO) transceiver or device, a Multiple Input Single Output (MISO) trans-ceiver or device, a device having one or more internal antennas and/or external antennas, Digital Video Broadcast (DVB) devices or systems, multi-standard radio devices or systems, a wired or wireless handheld device, e.g., a Smart-phone, a Wireless Application Protocol (WAP) device, or the like.

Some aspects may be used in conjunction with Radio Frequency (RF) systems, wireless communication systems, radar systems, vehicular radar systems, autonomous sys-tems, robotic systems, detection systems, and/or any other systems.

Some demonstrative aspects may be used in conjunction with an RF frequency in a frequency band having a starting frequency above 10 Gigahertz (GHz), for example, a fre-quency band having a starting frequency between 10 Ghz and 120 GHz. For example, some demonstrative aspects may be used in conjunction with an RF frequency having a starting frequency above 30 Ghz, for example, above 45 GHz, e.g., above 60 GHz. For example, some demonstrative aspects may be used in conjunction with an automotive radar frequency band, e.g., a frequency band between 76 GHz and 81 GHz. For example, some demonstrative aspects may be used in conjunction with wireless communication frequency band, for example, a wireless communication network com-municating over a frequency band of 2.4 GHz, 5 GHz, and/or 6-7 GHz, an Extremely High Frequency (EHF) band (the millimeter wave (mmWave) frequency band), e.g., a frequency band within the frequency band of between 20 GHz and 300 GHz, e.g., a frequency band above 45 GHz, a WLAN frequency band, a WPAN frequency band, and the like. However, other aspects may be implemented utilizing any other suitable frequency bands, for example, a frequency band above 140 GHz, a frequency band of 300 GHz, a sub Terahertz (Thz) band, a THz band, and/or any other frequency band.

Some demonstrative aspects may be used in conjunction with a WLAN, e.g., a WiFi network. Other aspects may be used in conjunction with any other suitable wireless com-munication network, for example, a wireless area network, a "piconet", a WPAN, a WVAN and the like.

Some aspects may be used in conjunction with devices and/or networks operating in accordance with existing IEEE 802.11 standards (including IEEE 802.11-2020 (*IEEE 802.11-2020, IEEE Standard for Information Technology—Telecommunications and Information Exchange between Systems Local and Metropolitan Area Networks—Specific Requirements; Part* 11: *Wireless LAN Medium Access Con-trol* (*MAC*) *and Physical Layer* (*PHY*) *Specifications, December,* 2020)), and/or future versions and/or derivatives thereof, devices and/or networks operating in accordance with existing cellular specifications and/or protocols, units and/or devices which are part of the above networks, and the like.

Some aspects may be used in conjunction with one or more types of wireless communication signals and/or sys-tems, for example, Radio Frequency (RF), Infra-Red (IR), Frequency-Division Multiplexing (FDM), Orthogonal FDM (OFDM), Orthogonal Frequency-Division Multiple Access (OFDMA), FDM Time-Division Multiplexing (TDM), Time-Division Multiple Access (TDMA), Multi-User MIMO (MU-MIMO), Spatial Division Multiple Access (SDMA), Extended TDMA (E-TDMA), General Packet Radio Service (GPRS), extended GPRS, Code-Division Multiple Access (CDMA), Wideband CDMA (WCDMA), CDMA 2000, single-carrier CDMA, multi-carrier CDMA, Multi-Carrier Modulation (MDM), Discrete Multi-Tone (DMT), Bluetooth®, Global Positioning System (GPS), Wi-Fi, Wi-Max, ZigBee™, Ultra-Wideband (UWB), Global System for Mobile communication (GSM), 2G, 2.5G, 3G, 3.5G, 4G, Fifth Generation (5G), or Sixth Generation (6G) mobile networks, 3GPP, Long Term Evolution (LTE), LTE advanced, Enhanced Data rates for GSM Evolution (EDGE), or the like. Other aspects may be used in various other devices, systems and/or networks.

The terms "processor" or "controller" may be understood to include any kind of technological entity that allows handling of any suitable type of data and/or information. The data and/or information may be handled according to one or more specific functions executed by the processor or con-troller. Further, a processor or a controller may be under-stood as any kind of circuit, e.g., any kind of analog or digital circuit. A processor or a controller may thus be or include an analog circuit, digital circuit, mixed-signal cir-cuit, logic circuit, processor, microprocessor, Central Pro-cessing Unit (CPU), Graphics Processing Unit (GPU), Digi-tal Signal Processor (DSP), Field Programmable Gate Array (FPGA), integrated circuit, Application Specific Integrated Circuit (ASIC), and the like, or any combination thereof. Any other kind of implementation of the respective func-tions, which will be described below in further detail, may also be understood as a processor, controller, or logic circuit. It is understood that any two (or more) processors, control-lers, or logic circuits detailed herein may be realized as a single entity with equivalent functionality or the like, and conversely that any single processor, controller, or logic circuit detailed herein may be realized as two (or more) separate entities with equivalent functionality or the like.

The term "memory" is understood as a computer-readable medium (e.g., a non-transitory computer-readable medium)

in which data or information can be stored for retrieval. References to "memory" may thus be understood as referring to volatile or non-volatile memory, including random access memory (RAM), read-only memory (ROM), flash memory, solid-state storage, magnetic tape, hard disk drive, optical drive, among others, or any combination thereof. Registers, shift registers, processor registers, data buffers, among others, are also embraced herein by the term memory. The term "software" may be used to refer to any type of executable instruction and/or logic, including firmware.

A "vehicle" may be understood to include any type of driven object. By way of example, a vehicle may be a driven object with a combustion engine, an electric engine, a reaction engine, an electrically driven object, a hybrid driven object, or a combination thereof. A vehicle may be, or may include, an automobile, a bus, a mini bus, a van, a truck, a mobile home, a vehicle trailer, a motorcycle, a bicycle, a tricycle, a train locomotive, a train wagon, a moving robot, a personal transporter, a boat, a ship, a submersible, a submarine, a drone, an aircraft, a rocket, among others.

A "ground vehicle" may be understood to include any type of vehicle, which is configured to traverse the ground, e.g., on a street, on a road, on a track, on one or more rails, off-road, or the like.

An "autonomous vehicle" may describe a vehicle capable of implementing at least one navigational change without driver input. A navigational change may describe or include a change in one or more of steering, braking, acceleration/deceleration, or any other operation relating to movement, of the vehicle. A vehicle may be described as autonomous even in case the vehicle is not fully autonomous, for example, fully operational with driver or without driver input. Autonomous vehicles may include those vehicles that can operate under driver control during certain time periods, and without driver control during other time periods. Additionally or alternatively, autonomous vehicles may include vehicles that control only some aspects of vehicle navigation, such as steering, e.g., to maintain a vehicle course between vehicle lane constraints, or some steering operations under certain circumstances, e.g., not under all circumstances, but may leave other aspects of vehicle navigation to the driver, e.g., braking or braking under certain circumstances. Additionally or alternatively, autonomous vehicles may include vehicles that share the control of one or more aspects of vehicle navigation under certain circumstances, e.g., hands-on, such as responsive to a driver input; and/or vehicles that control one or more aspects of vehicle navigation under certain circumstances, e.g., hands-off, such as independent of driver input. Additionally or alternatively, autonomous vehicles may include vehicles that control one or more aspects of vehicle navigation under certain circumstances, such as under certain environmental conditions, e.g., spatial areas, roadway conditions, or the like. In some aspects, autonomous vehicles may handle some or all aspects of braking, speed control, velocity control, steering, and/or any other additional operations, of the vehicle. An autonomous vehicle may include those vehicles that can operate without a driver. The level of autonomy of a vehicle may be described or determined by the Society of Automotive Engineers (SAE) level of the vehicle, e.g., as defined by the SAE, for example in *SAE J*3016 2018: *Taxonomy and definitions for terms related to driving automation systems for on road motor vehicles*, or by other relevant professional organizations. The SAE level may have a value ranging from a minimum level, e.g., level 0 (illustratively, substantially no driving automation), to a maximum level, e.g., level 5 (illustratively, full driving automation).

An "assisted vehicle" may describe a vehicle capable of informing a driver or occupant of the vehicle of sensed data or information derived therefrom.

The phrase "vehicle operation data" may be understood to describe any type of feature related to the operation of a vehicle. By way of example, "vehicle operation data" may describe the status of the vehicle, such as, the type of tires of the vehicle, the type of vehicle, and/or the age of the manufacturing of the vehicle. More generally, "vehicle operation data" may describe or include static features or static vehicle operation data (illustratively, features or data not changing over time). As another example, additionally or alternatively, "vehicle operation data" may describe or include features changing during the operation of the vehicle, for example, environmental conditions, such as weather conditions or road conditions during the operation of the vehicle, fuel levels, fluid levels, operational parameters of the driving source of the vehicle, or the like. More generally, "vehicle operation data" may describe or include varying features or varying vehicle operation data (illustratively, time varying features or data).

The term "wireless device", as used herein, includes, for example, a device capable of wireless communication, a communication device capable of wireless communication, a communication station capable of wireless communication, a portable or non-portable device capable of wireless communication, or the like. In some demonstrative aspects, a wireless device may be or may include a peripheral that may be integrated with a computer, or a peripheral that may be attached to a computer. In some demonstrative aspects, the term "wireless device" may optionally include a wireless service.

The term "communicating" as used herein with respect to a communication signal includes transmitting the communication signal and/or receiving the communication signal. For example, a communication unit, which is capable of communicating a communication signal, may include a transmitter to transmit the communication signal to at least one other communication unit, and/or a communication receiver to receive the communication signal from at least one other communication unit. The verb communicating may be used to refer to the action of transmitting or the action of receiving. In one example, the phrase "communicating a signal" may refer to the action of transmitting the signal by a first device, and may not necessarily include the action of receiving the signal by a second device. In another example, the phrase "communicating a signal" may refer to the action of receiving the signal by a first device, and may not necessarily include the action of transmitting the signal by a second device. The communication signal may be transmitted and/or received, for example, in the form of Radio Frequency (RF) communication signals, and/or any other type of signal.

As used herein, the term "circuitry" may refer to, be part of, or include, an Application Specific Integrated Circuit (ASIC), an integrated circuit, an electronic circuit, a processor (shared, dedicated or group), and/or memory (shared. Dedicated, or group), that execute one or more software or firmware programs, a combinational logic circuit, and/or other suitable hardware components that provide the described functionality. In some aspects, some functions associated with the circuitry may be implemented by one or more software or firmware modules. In some aspects, circuitry may include logic, at least partially operable in hardware.

The term "logic" may refer, for example, to computing logic embedded in circuitry of a computing apparatus and/or computing logic stored in a memory of a computing apparatus. For example, the logic may be accessible by a processor of the computing apparatus to execute the computing logic to perform computing functions and/or operations. In one example, logic may be embedded in various types of memory and/or firmware, e.g., silicon blocks of various chips and/or processors. Logic may be included in, and/or implemented as part of, various circuitry, e.g. radio circuitry, receiver circuitry, control circuitry, transmitter circuitry, transceiver circuitry, processor circuitry, and/or the like. In one example, logic may be embedded in volatile memory and/or non-volatile memory, including random access memory, read only memory, programmable memory, magnetic memory, flash memory, persistent memory, and the like. Logic may be executed by one or more processors using memory, e.g., registers, stuck, buffers, and/or the like, coupled to the one or more processors, e.g., as necessary to execute the logic.

The term "antenna", as used herein, may include any suitable configuration, structure and/or arrangement of one or more antenna elements, components, units, assemblies and/or arrays. In some aspects, the antenna may implement transmit and receive functionalities using separate transmit and receive antenna elements. In some aspects, the antenna may implement transmit and receive functionalities using common and/or integrated transmit/receive elements. The antenna may include, for example, a phased array antenna, a single element antenna, a set of switched beam antennas, and/or the like.

Some demonstrative aspects are described herein with respect to RF signals, e.g., RF radar signals, and/or RF wireless communication signals. However, other aspects may be implemented with respect to any other wireless signals, wireless communication signals, communication scheme, network, standard and/or protocol.

Reference is now made to FIG. 1, which schematically illustrates a block diagram of a system 101, in accordance with some demonstrative aspects.

In some demonstrative aspects, system 101 may include at least one device 102, e.g., as described below.

In some demonstrative aspects, device 102 may include a radar device. For example, device 102 may include a radar detecting device, a radar sensing device, a radar sensor, or the like, e.g., as described below.

In some demonstrative aspects, device 102 may include a Multiple Input Multiple Output (MIMO) radar, e.g., as described below.

In other aspects, device 102 may include any other type of radar, e.g., as described below.

In some demonstrative aspects, device 102 may be configured to detect, and/or sense, one or more objects, which are located in a vicinity, e.g., a far vicinity and/or a near vicinity, to radar 102, and to provide one or more parameters, attributes, and/or information with respect to the objects.

In some demonstrative aspects, device 102 may be implemented, for example, as part of a vehicular system.

In some demonstrative aspects, the vehicular system may include, for example, an autonomous vehicle system, an automated driving system, a driver assistance and/or support system, and/or the like.

In some demonstrative aspects, system 101 may include a vehicular system including a vehicle 100, e.g., as described below.

In some demonstrative aspects, one or more elements and/or components of device 102 may be implemented and/or mounted in vehicle 100.

In some demonstrative aspects, device 102 may be configured to detect, and/or sense, one or more objects, which are located in a vicinity, e.g., a far vicinity and/or a near vicinity, of the vehicle 100, and to provide one or more parameters, attributes, and/or information with respect to the objects.

In some demonstrative aspects, the objects may include other vehicles, pedestrians, traffic signs, traffic lights, roads and/or the like.

In some demonstrative aspects, the one or more parameters, attributes and/or information with respect to an object may include a range of the object from the vehicle 100, an angle of the object with respect to the vehicle 100, a location of the object with respect to the vehicle 100, a relative speed of the object, and/or the like.

In some demonstrative aspects, device 102 may include an information processor 196 configured to perform and/or to trigger, cause, instruct and/or control device 102 to perform one or more functionalities, operations and/or procedures, and/or to communicate one or more messages and/or transmissions.

In some demonstrative aspects, information processor 196 may include, or may be implemented, partially or entirely, by circuitry and/or logic, e.g., one or more processors including circuitry and/or logic, memory circuitry and/or logic. Additionally or alternatively, one or more functionalities of information processor 196 may be implemented by logic, which may be executed by a machine and/or one or more processors, e.g., as described below.

In one example, information processor 196 may include at least one memory, e.g., coupled to the one or more processors, which may be configured, for example, to store, e.g., at least temporarily, at least some of the information processed by the one or more processors and/or circuitry, and/or which may be configured to store logic to be utilized by the processors and/or circuitry.

In other aspects, information processor 196 may be implemented by one or more additional or alternative elements of device 102.

In some demonstrative aspects, information processor 196 may include a radar processor configured to process radar information of radar device 102 and/or to control one or more operations of radar device 102, e.g., as described below.

In some demonstrative aspects, information processor 196 may be configured to generate radar information, for example, based on radar signals communicated by device 102, e.g., as described below.

In some demonstrative aspects, vehicle 100 may include a vehicular controller 124 configured to control one or more functionalities, components, devices, systems and/or elements of vehicle 100.

In some demonstrative aspects, vehicular controller 124 may be configured to control one or more vehicular systems 118 of vehicle 100, e.g., as described below.

In some demonstrative aspects, vehicular systems 118 may include, for example, a steering system, a braking system, a driving system, and/or any other system of the vehicle 100.

In some demonstrative aspects, vehicular controller 124 may configured to control device 102, and/or to process one or more parameters, attributes and/or information from information processor 196 and/or device 102.

In some demonstrative aspects, vehicular controller 124 may be configured, for example, to control the vehicular systems 118 of the vehicle, for example, based on the radar information from information processor 196, and/or one or more other sensors of the vehicle, e.g., Light Detection and Ranging (LIDAR) sensors, camera sensors, and/or the like.

In one example, vehicular controller 124 may control the steering system, the braking system, and/or any other vehicular systems 118 of vehicle 100, for example, based on the information from device 102, e.g., based on one or more objects detected by device 102.

In other aspects, vehicular controller 124 may be configured to control any other additional or alternative functionalities of vehicle 100.

In some demonstrative aspects, device 102 may include or may be implemented as part of a wireless communication device configured to communicate with one or more other wireless communication devices in a wireless communication system.

In some demonstrative aspects, system 100 may include a wireless communication system including the wireless communication device 102.

In some demonstrative aspects, information processor 196 may be configured to control and/or process one or more wireless communications to be transmitted by and/or received by device 102. For example, information processor 196 may be configured to process information to be transmitted in a wireless communication transmission by device 102, and/or to process information received by device 102 in one or more wireless communication transmissions.

In one example, device 102 may include, for example, a UE, an MD, a STA, a Smartphone, mobile phone, a cellular telephone, an AP, a PC, a desktop computer, a mobile computer, a laptop computer, an Ultrabook™ computer, a notebook computer, a tablet computer, a server computer, a handheld computer, an Internet of Things (IoT) device, a sensor device, a handheld device, a wearable device, a PDA device, a handheld PDA device, an on-board device, an off-board device, a hybrid device (e.g., combining cellular phone functionalities with PDA device functionalities), a consumer device, a vehicular device, a non-vehicular device, a mobile or portable device, a non-mobile or non-portable device, a PCS device, a PDA device which incorporates a wireless communication device, a mobile or portable GPS device, a DVB device, a relatively small computing device, a non-desktop computer, a "carry Small Live Large" (CSLL) device, an Ultra Mobile Device (UMD), an Ultra Mobile PC (UMPC), a Mobile Internet Device (MID), or the like.

In some demonstrative aspects, device 102 may include, for example, one or more of a processor 191, an input unit 192, an output unit 193, a memory unit 194, and/or a storage unit 195. Device 102 may optionally include other suitable hardware components and/or software components. In some demonstrative aspects, some or all of the components of one or more of device 102 may be enclosed in a common housing or packaging, and may be interconnected or operably associated using one or more wired or wireless links. In other aspects, components of one or more of device 102 may be distributed among multiple or separate devices.

In some demonstrative aspects, processor 191 may include, for example, a Central Processing Unit (CPU), a Digital Signal Processor (DSP), one or more processor cores, a single-core processor, a dual-core processor, a multiple-core processor, a microprocessor, a host processor, a controller, a plurality of processors or controllers, a chip, a microchip, one or more circuits, circuitry, a logic unit, an Integrated Circuit (IC), an Application-Specific IC (ASIC), or any other suitable multi-purpose or specific processor or controller. Processor 191 executes instructions, for example, of an Operating System (OS), e.g., a vehicular operating system, of device 102 and/or of one or more suitable applications.

In some demonstrative aspects, input unit 192 may include, for example, a touch-screen, a touch-pad, a track-ball, a stylus, a microphone, or other suitable pointing device or input device. Output unit 193 includes, for example, a monitor, a screen, a touch-screen, a flat panel display, a Light Emitting Diode (LED) display unit, a Liquid Crystal Display (LCD) display unit, one or more audio speakers or earphones, or other suitable output devices.

In some demonstrative aspects, memory unit 194 includes, for example, a Random Access Memory (RAM), a Read Only Memory (ROM), a Dynamic RAM (DRAM), a Synchronous DRAM (SD-RAM), a flash memory, a volatile memory, a non-volatile memory, a cache memory, a buffer, a short term memory unit, a long term memory unit, or other suitable memory units. Storage unit 195, for example, a hard disk drive, a floppy disk drive, a Compact Disk (CD) drive, a CD-ROM drive, a DVD drive, or other suitable removable or non-removable storage units. Memory unit 194 and/or storage unit 195, for example, may store data processed by device 102.

In some demonstrative aspects, information processor 196 may be configured to perform and/or to trigger, cause, instruct and/or control device 102 to perform one or more functionalities, operations and/or procedures, and/or to perform one or more wireless communications, to generate and/or communicate one or more messages and/or wireless transmissions.

In some demonstrative aspects, device 102 may include a message processor 128 configured to generate, process and/or access one or more messages communicated by device 102.

In one example, message processor 128 may be configured to generate one or more messages to be transmitted by device 102, and/or message processor 128 may be configured to access and/or to process one or more messages received by device 102, e.g., as described below.

In some demonstrative aspects, message processor 128 may include, or may be implemented, partially or entirely, by circuitry and/or logic, e.g., one or more processors including circuitry and/or logic, memory circuitry and/or logic. Additionally or alternatively, one or more functionalities of message processor 128 may be implemented by logic, which may be executed by a machine and/or one or more processors, e.g., as described below.

In some demonstrative aspects, at least part of the functionality of message processor 128 may be implemented as part of information processor 196.

In other aspects, the functionality of message processor 128 may be implemented as part of any other element of device 102.

In some demonstrative aspects, at least part of the functionality of information processor 196 and/or message processor 128 may be implemented by an integrated circuit, for example, a chip, e.g., a System on Chip (SoC). In one example, the chip or SoC may be configured to perform one or more functionalities of information processor 196, and one or more functionalities of message processor 128. In one example, information processor 196 and message processor 128 may be implemented as part of the chip or SoC.

In other aspects, information processor 196 and/or message processor 128 may be implemented by one or more additional or alternative elements of device 102.

In some demonstrative aspects, device 102 may include one or more Physical Layer (PHY) chains 120 configured to communicate RF signals, for example, RF radar signals and/or RF wireless communication signals.

In some demonstrative aspects, PHY chains 120 may include RF elements, RF circuitry and/or RF logic; baseband elements, circuitry and/or logic; modulation elements, circuitry and/or logic; demodulation elements, circuitry and/or logic; amplifiers; analog to digital and/or digital to analog converters; filters; and/or the like.

In some demonstrative aspects, device 102 may include one or more antennas 107 connected to the one or more PHY chains 120, e.g., as described below.

In some demonstrative aspects, the one or more antennas 107 may include, or may be implemented by, a Multiple-Input-Multiple-Output (MIMO) antenna, for example, a MIMO radar antenna and/or a MIMO wireless communication antenna e.g., as described below. In other aspects, the one or more antennas 107 may include, or may be implemented by, any other type of antenna.

In one example, antennas 107 may include or may be part of any type of antennas suitable for transmitting and/or receiving radar signals and/or wireless communication signals. For example, antennas 107 may be implemented as part of any suitable configuration, structure, and/or arrangement of one or more antenna elements, components, units, assemblies, and/or arrays. For example, antennas 107 may be implemented as part of a phased array antenna, a multiple element antenna, a set of switched beam antennas, and/or the like. In some aspects, antennas 107 may be implemented to support transmit and receive functionalities using separate and/or different transmit antenna elements and receive antenna elements. In some aspects, antennas 107 may be implemented to support transmit and receive functionalities using common and/or integrated transmit/receive elements.

In some demonstrative aspects, information processor 196 may be configured to generate radar information, for example, based on radar signals communicated by the plurality of PHY chains 120 via the plurality of antennas 107, for example, when device 102 is implemented as part of, or includes, a radar device, e.g., as described below.

In some demonstrative aspects, information processor 196 may be configured to process wireless communication signals communicated by the plurality of PHY chains 120 via the plurality of antennas 107, for example, when device 102, is implemented as part of, or includes, a wireless communication device.

In some demonstrative aspects, device 102 may include at least one Local Oscillator (LO) generator configured to generate an LO signal 125, e.g., as described below.

In some demonstrative aspects, LO generator 130 may be implemented as a separate element of device 102, e.g., which may be external to and/or separate from the PHY chains 120. For example, the LO generator 130 may be configured to provide the LO signal 125 to one or more PHY chains 120.

In one example, LO signal 125 may be applied, for example, over an off-board LO distribution, e.g., in an implementation where LO signal 125 is generated and/or modulated outside of and/or separate from, PHY chains 120.

In some demonstrative aspects, LO generator 130 may be implemented as part of a PHY chain 120.

In some demonstrative aspects, a PHY chain 120 may include one or more PHY elements, which may be driven by an LO clock signal, which may be based, for example, on the LO signal 125, e.g., as described below.

In some demonstrative aspects, a PHY chain 120 may include a frequency mixer 132, which may be driven by the LO clock signal, which may be based on the LO signal 125, e.g., as described below.

In some demonstrative aspects, PHY chains 120 may include one or more RF elements 134, which may be configured to communicate RF signals, for example, based on the LO signal 125, e.g., as described below.

In some demonstrative aspects, for example, the RF elements 134 may include, for example, modulation elements, circuitry and/or logic; demodulation elements, circuitry and/or logic; amplifiers; analog to digital and/or digital to analog converters; filters, and the like.

In some demonstrative aspects, the RF signals may include wireless communication signals, for example, in an implementation where device 102 includes a wireless communication device.

In some demonstrative aspects, the RF signals may include radar signals, for example, in an implementation where device 102 includes a radar.

In some demonstrative aspects, the frequency mixer 125 may be driven by an LO clock signal having a relatively high frequency, e.g., as described below.

In some demonstrative aspects, the frequency mixer 125 may be driven by an LO clock signal having a frequency above 10 Gigahertz (GHz), for example, a frequency between 10 GHz and 120 GHz. For example, the frequency mixer 125 may be driven by an LO clock signal having a frequency above 30 GHz, for example, above 45 GHz, e.g., above 60 GHz.

In one example, the frequency mixer 125 may be driven by an LO clock signal having a frequency between 76 GHz and 81 GHz, e.g., to support an implementation of automotive radar, and/or any other implementation.

In another example, the frequency mixer 125 may be driven by an LO clock signal having a frequency above 45 GHz, e.g., to support an implementation of wireless communication over a mmWave frequency band.

In other aspects, the frequency mixer 125 may be driven by an LO clock signal having any other frequency band and/or range.

In some demonstrative aspects, there may be a need to provide a technical solution to generate an LO clock signal having a relatively high frequency, e.g., above 10 GHz.

For example, in some use cases, and/or scenarios, there may be one or more technical inefficiencies, disadvantages and/or problems in implementing Direct LO clock generation techniques using a Phased Lock Loop (PLL) to directly generate a desired LO frequency. For example, a Digital PLL (DPLL) may be utilized to directly generate an LO frequency of 27 GHz, e.g., without using frequency multiplication. According to this example, a divide-by-2 or a 25% duty cycle generator block may follow the DPLL, for example, to generate an in-phase and quadrature (I/Q) LO frequency for a mixer.

In one example, a PLL for the mmWave frequency band, e.g., a Digitally Controlled Oscillator (DCO), may be very hard to design, for example, due to stringent phase noise requirements.

In another example, a PLL for the mmWave frequency band may have high power consumption, which may create a bottleneck for maintaining performance in a limited power budget.

In another example, distribution of an LO at the mmWave frequency may have high power consumption, and may be susceptible to layout parasitics.

In another example, implementation of a wideband DPLL may deteriorate phase-noise performance. Accordingly, implementation of the direct LO clock generation techniques may require using multiple DPLLs, for example, to support multiple bands of operation.

For example, in some use cases, and/or scenarios, there may be one or more technical inefficiencies, disadvantages and/or problems in implementing a multi-stage doubler/tripler based LO multiplier. For example, a 9 GHz LO frequency may be multiplied by 2-stage triplers, for example, to generate a frequency of 81 GHz, e.g., for automotive radar systems.

In one example, the multi-stage doubler/tripler based LO multiplier may occupy a large die-area. For example, a multiplication factor of 9 may require two cascade triplers, for example, to generate an 81 GHz LO frequency from a 9 GHz LO frequency, e.g., which may be generated by a PLL. According to this example, a first stage matching network of the LO multiplier at 9 GHz may be bulky. According to this example, the LO multiplier may consume relatively high power, for example, due to a long chain of blocks, e.g., including a Polyphaser Filter (PPF), a tripler, a matching network, a buffer, and/or the like. For example, a power consumption of the LO multiplier may be around 60-70 milliwatts (mW), and/or the multi-stage doubler/tripler based LO multiplier may occupy an area of about 1 mm².

In another example, the multi-stage doubler/tripler based LO multiplier may not provide any substantial power gain. Accordingly, implementations using the multi-stage doubler/tripler based LO multiplier may require use of a pre-driver amplifier followed by a three-stage PA, for example, to provide a required output power, e.g., of 10 decibel-milliwatts (dBm) for radar line-up. Accordingly, a whole chain of the multi-stage doubler/tripler based LO multiplier may have high power consumption, e.g., about 200 milliwatt (mW).

In another example, a particular design of the multi-stage doubler/tripler based LO multiplier may be constrained to a specific multiplication factor. For example, a different multiplication factor may require a re-design, e.g., even a complete re-design, of the multi-stage doubler/tripler based LO multiplier.

In another example, the multi-stage doubler/tripler based LO multiplier may require re-design, for example, if a load, e.g., a mixer, changes, for example, even if the multiplication factor is kept unchanged.

In another example, an overall power gain of the multi-stage doubler/tripler based LO multiplier may be very low, or they may not be any substantial gain.

For example, in some use cases, and/or scenarios, there may be one or more technical inefficiencies, disadvantages and/or problems in implementing an injection locking based LO multiplier. For example, the injection locking based LO multiplier may use an injection locked oscillator to generate a desired channel LO frequency. For example, a fifth-harmonic locked oscillator driven by a 9 GHz LO frequency may be used to generate an LO frequency of 45 GHz.

In one example, the injection locking based LO multiplier may rely on LO summation. For example, a multiplication by 3 may require three 120 degree phase shifted LOs. However, a third harmonic generation, e.g., through summation of three square waves, may result in significant loss, e.g., about 9.5 dB loss, due to combining. For example, a locking strength (phase noise) may decrease, e.g., as the power of a locking signal decreases. Therefore, it may be hard to achieve a high multiplication factor, for example, multiplication beyond a multiplication factor of 5, when implementing the injection locking based LO multiplier.

In another example, the injection locking based LO multiplier may suffer from low output power delivery capacity, and, therefore, may only be used to drive a mixer.

In another example, the injection locking based LO multiplier may achieve only odd multiplication, e.g., with reasonable injection locking strength.

In some demonstrative aspects, device 102 may include a digitally-controlled frequency multiplier 140 controllable according to a digital control input 142, e.g., as described below.

In some demonstrative aspects, digitally-controlled frequency multiplier 140 may be controllable, for example, according to digital control input 142, to generate an output frequency signal 146 having an output frequency, for example, by multiplying an input frequency of an input frequency signal 143, e.g., as described below.

In some demonstrative aspects, digitally-controlled frequency multiplier 140 may be implemented as a multiplier, for example, an LO multiplier, to generate a multiplied LO signal, e.g., as described below.

In some demonstrative aspects, digitally-controlled frequency multiplier 140 may be implemented as part of LO generator 130, which may generate the input frequency signal 143, for example, based on an input signal 123, for example, when digitally-controlled frequency multiplier 140 is implemented as a multiplier.

In some demonstrative aspects, digitally-controlled frequency multiplier 140 may be configured to receive the input frequency signal 143, for example, which may be generated at LO signal generator 130.

In some demonstrative aspects, digitally-controlled frequency multiplier 140 may be configured to generate the output frequency signal 146, for example, based on the LO signal generated at LO signal generator 130.

In some demonstrative aspects, digitally-controlled frequency multiplier 140 may be configured to generate the output frequency signal 146, for example, in the form of the LO signal 125 to be provided to one or more elements of the PHY chain 120, e.g., to mixer 132.

In some demonstrative aspects, mixer 132 may be driven by the LO signal 125, which may include the output frequency signal 146 from digitally-controlled frequency multiplier 140.

In some demonstrative aspects, digitally-controlled frequency multiplier 140 may be implemented as a digital PA 136 of a PHY chain 120, e.g., as described below.

In some demonstrative aspects, the digital PA 136 may be configured to transmit an RF signal via an antenna 107 based on the input frequency signal 143, e.g., as described below.

In some demonstrative aspects, the digitally-controlled frequency multiplier 140 of the digital PA may be configured to generate the output frequency signal 146 including the RF signal, for example, based on the input frequency signal 143, which may include a phase-modulated LO signal, e.g., as described below.

In some demonstrative aspects, digitally-controlled frequency multiplier 140 may be configured to multiply a low frequency LO input from a PLL, e.g., input frequency signal 143, and to generate a high frequency LO output, e.g., output frequency signal 146, for example, using digital techniques, e.g., as described below.

In some demonstrative aspects, the output frequency of the output frequency signal 146 may be controllable, for example, via digital configuration bits, e.g., in digital control input 142, for example, using a same circuit, e.g., as described below.

In some demonstrative aspects, digitally-controlled frequency multiplier 140 may be configured to deliver a relatively high output power, e.g., about 13 dBm or any other power level, for example, even at high mm-Wave frequencies. Accordingly, digitally-controlled frequency multiplier 140 may be configured to provide a technical solution for frequency multiplication, which may be adoptable as a digital PA, for example, a polar digital PA, e.g., as described below.

n some demonstrative aspects, digitally-controlled frequency multiplier 140 may be configured to provide output frequency signal 146 including a sinusoidal output, which may be suitable, for example, for driving active mixers, e.g., frequency mixer 132 as described below.

In some demonstrative aspects, digitally-controlled frequency multiplier 140 may be configured to generate static phase offsets, and to generate the output frequency signal 146, for example, based on the static phase offsets, e.g., as described below.

In some demonstrative aspects, digitally-controlled frequency multiplier 140 may be configured to generate the static phase offsets, for example, by a delay-locked loop (DLL) and/or an edge-interpolator (DCEI), e.g., as described below.

In other aspects, digitally-controlled frequency multiplier 140 may be configured to generate the static phase offsets according to any other mechanism.

In some demonstrative aspects, digitally-controlled frequency multiplier 140 may include a plurality of multipliers, e.g., tri-state digital unit cells and/or any other multipliers, e.g., as described below.

In some demonstrative aspects, the plurality of multipliers may be configured to provide a technical solution to achieve a relatively high frequency output, for example, even if digitally-controlled frequency multiplier 140 is driven by a relatively low clock rate, for example, a much more lower clock rate, e.g., as described below.

In some demonstrative aspects, digitally-controlled frequency multiplier 140 may be configured to provide a technical solution to support generating, e.g., locally, multiple different LO signals, for example, from a same (global) low frequency LO signal, e.g., input frequency signal 143, for example, to support multiple bands of operation.

In some demonstrative aspects, digitally-controlled frequency multiplier 140 may be configured to utilize a relatively small number of compact switched-capacitor unit cells to provide a technical solution supporting multiple bands of operation, e.g., as described below.

In some demonstrative aspects, digitally-controlled frequency multiplier 140 may be configured to provide a technical solution utilizing multipliers based on inverter cells, which may be compact, e.g., compared to other types of multipliers, which occupy huge die area, and/or may not provide power gain.

In one example, a 9× multiplier architecture may include multiple matching networks, and polyphaser filters, which may occupy a large area, e.g., especially for low frequencies.

In some demonstrative aspects, digitally-controlled frequency multiplier 140 may be configured to provide a technical solution, which may be adapted and/or reusable for different system requirements. For example, a multiplication factor and/or gain of digitally-controlled frequency multiplier 140 may be configured digitally, for example, to adapt to different system requirements, e.g., as described below.

In some demonstrative aspects, digitally-controlled frequency multiplier 140 may be configured to provide a technical solution to support distribution of a PLL and/or LO distribution at relatively low RF frequencies, e.g., non-mmWave frequencies. The ability to support distribution of the PLL and/or LO distribution at relatively low RF frequencies, may support design of a VCO/DCO in the PLL for optimum phase-noise, e.g., without gathering extra penalty in Q degradation for mm-wave operation. For example, dividers in a PLL feedback may be CMOS-based, e.g., instead of using Current Mode Logic (CML) or injection-locked methods. For example, these designs may save power in the PLL. For example, an RF LO distribution network may also save power compared to mm-wave LO distribution.

In some demonstrative aspects, digitally-controlled frequency multiplier 140 may be configured to provide a technical solution to support generation of a wide range of frequencies according to a wide range of frequency multiplication factors, for example, ranging from a 2×LO frequency to a 33×LO frequency or any other frequency multiplication factor, e.g., even fractions of LO frequency.

In some demonstrative aspects, the ability to support generation of a wide range of frequencies according to a wide range of frequency multiplication factors may be advantageous, for example, for interference mitigation. For example, a Radar Tx/Rx chain may be configured to utilize a 9*LO multiplier to produce an 81 GHz output frequency, e.g., based on a 9 GHz LO frequency. According to this example, in case of interference near the frequency of 9 GHz, digitally-controlled frequency multiplier 140 may switch to a different LO frequency without or with less interference, e.g., an LO frequency of 8.1 GHz, and to re-tune for a multiplication of 10, which may provide the 81 GHz output frequency, e.g., 10*8.1 GHz.

In some demonstrative aspects, digitally-controlled frequency multiplier 140 may be configured as a polar Digital PA (DPA), e.g., PA 136, having frequency configurability, e.g., as described below.

In some demonstrative aspects, digitally-controlled frequency multiplier 140 may have a power delivery capacity, for example, in opposed to the tripler/doubler based LO multiplier and/or the injection locked oscillator based LO multiplier, e.g., as described below.

In some demonstrative aspects, digitally-controlled frequency multiplier 140 may be configured to provide a technical solution for a frequency multiplier, which may be re-used as an LO multiplier, for example, in an analog Tx/Rx lineup, or as a polar digital PA, e.g., as described below.

In some demonstrative aspects, digital control input 142 may be configured as a 3-way knob input, for example, to support flexible re-usability and/or configurability, for example, in terms of amplitude modulation, phase modulation and/or operating frequency, e.g., as described below.

In some demonstrative aspects, control input 142 may be configured to support a frequency multiplication control input to control frequency multiplication factor, for example, to support dynamic frequency multiplication of input frequency signal 143, e.g., as described below.

In some demonstrative aspects, control input 142 may be configured to support an amplitude modulation control input to control an amplitude modulation level, for example, to support dynamic gain control of a gain of output frequency signal 146, e.g., as described below.

In some demonstrative aspects, control input 142 may be configured to support a phase modulation control input to control an amplitude modulation level, for example, to support dynamic phase control of a phase of output frequency signal 146, e.g., as described below.

In other aspects, digital control input 142 may include any other input mechanism and/or configuration.

In some demonstrative aspects, digitally-controlled frequency multiplier 140 may be implemented to provide a technical solution to facilitate low frequency LO distribution for a multi-chip system, for example, for a small cell/infrastructure mm-Wave implementation, e.g., as described below.

Figure 2:
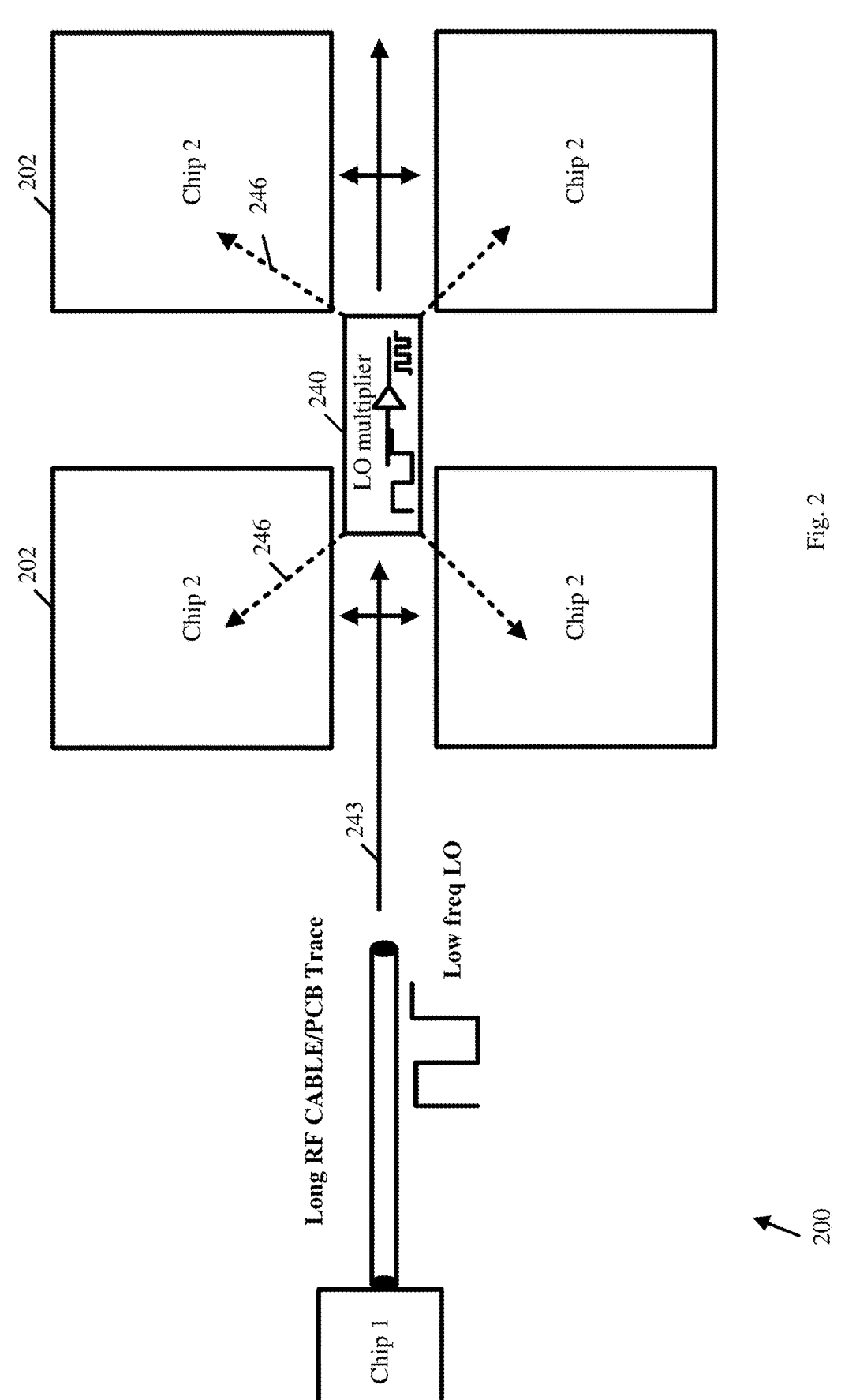
FIG. 2 is a schematic illustration of a multi-chip system, in accordance with some demonstrative aspects.

Reference is made to FIG. 2, which schematically illustrates a multi-chip system 200, in accordance with some demonstrative aspects.

In some demonstrative aspects, multi-chip system 200 may be used, for example, in one or more infrastructural applications.

In some demonstrative aspects, as shown in FIG. 2, system 200 may include a plurality of chips 202. For example, a chip 202 may include one or more elements of device 102 (FIG. 1), e.g., a PHY chain 120 (FIG. 1), and/or may perform one or more operations and/or functionalities of device 102 (FIG. 1), e.g., a PHY chain 120 (FIG. 1).

In some demonstrative aspects, as shown in FIG. 2, system 200 may include a digitally-controlled frequency multiplier 240. For example, digitally-controlled frequency multiplier 140 (FIG. 1) may include digitally-controlled frequency multiplier 240, and/or may perform one or more operations and/or functionalities of digitally-controlled frequency multiplier 240.

In some demonstrative aspects, as shown in FIG. 2, digitally-controlled frequency multiplier 240 may receive a low frequency input signal 243 and may output an output frequency signal 246 having a high output frequency, for example, by multiplying the input frequency of the input frequency signal 243.

In some demonstrative aspects, as shown in FIG. 2, the output signal 246 having the high output frequency may be distributed to the plurality of chips 202.

Figure 3:
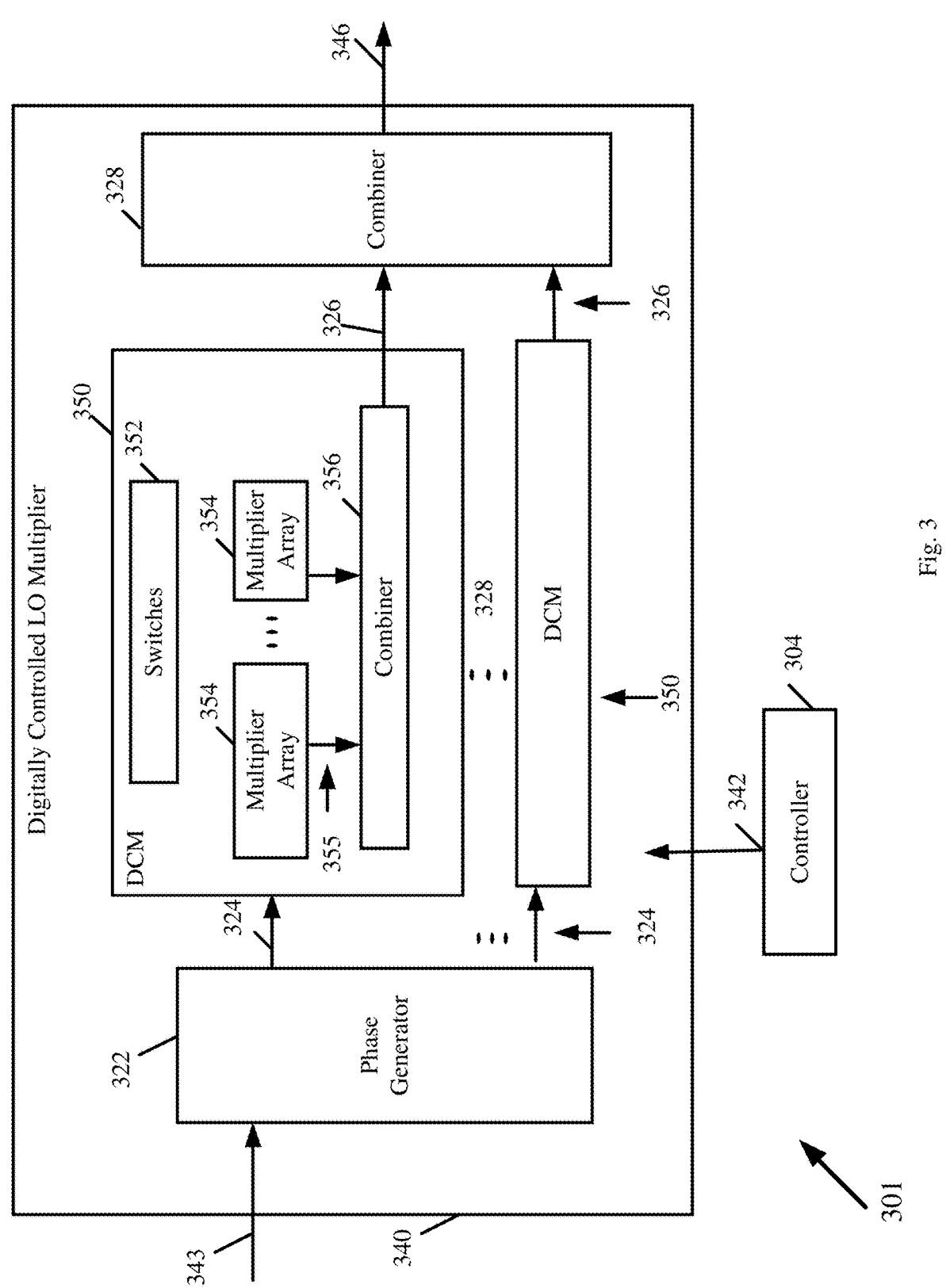
FIG. 3 is a schematic block diagram illustration of an apparatus including a digitally-controlled frequency multiplier, in accordance with some demonstrative aspects.

Reference is made to FIG. 3, which schematically illustrates an apparatus 301 including a digitally-controlled frequency multiplier 340, in accordance with some demonstrative aspects. For example, digitally-controlled frequency multiplier 140 (FIG. 1) may include one or more elements of digitally-controlled frequency multiplier 340, and/or may perform one or more operations and/or functionalities of digitally-controlled frequency multiplier 340.

In some demonstrative aspects, as shown in FIG. 3, digitally-controlled frequency multiplier 340 may be controllable according to a digital control input 342, to generate an output frequency signal 346 having an output frequency by multiplying an input frequency of an input frequency signal 343, e.g., as described below.

In some demonstrative aspects, the input frequency of input frequency signal 343 may be at least 1 gigahertz (GHz).

In some demonstrative aspects, the input frequency of input frequency signal 343 may be at least 2 GHz.

In some demonstrative aspects, the input frequency of input frequency signal 343 may be at least 4 GHz.

In some demonstrative aspects, the input frequency of input frequency signal 343 may be at least 5 GHz.

In other aspects, any other input frequency may be implemented.

In some demonstrative aspects, digitally-controlled frequency multiplier 340 may be configured to multiply an LO signal from an LO generator, e.g., LO generator 130 (FIG. 1), e.g., as described above. For example, input frequency signal 343 may include an LO signal generated by LO generator 130 (FIG. 1), e.g., as described above. For example, output frequency signal 346 may be provided to drive a frequency mixer, e.g., mixer, 132 (FIG. 1), as described above.

In some demonstrative aspects, digitally-controlled frequency multiplier 340 may be implemented as part of a digital PA, e.g., PA 136 (FIG. 1). For example, digitally-controlled frequency multiplier 340 may be configured to generate the output frequency signal 346 including an RF signal to be transmitted via an antenna, e.g., antenna 107 (FIG. 1). For example, digitally-controlled frequency multiplier 340 may be configured to generate the output frequency signal 346 including an RF signal based on the input frequency signal 343 including a phase-modulated LO signal, e.g., as described above.

In some demonstrative aspects, as shown in FIG. 3, digitally-controlled frequency multiplier 340 may include a phase generator 322 configured to generate a plurality of phase-shifted signal groups 324 corresponding to a respective plurality of first phase-shifts applied to the input frequency signal 343, e.g., as described below.

In some demonstrative aspects, a phase-shifted signal group 324 corresponding to a first phase-shift may include a plurality of phase-shifted signals, for example, based on a respective plurality of second phase-shifts, e.g., as described below.

In some demonstrative aspects, the plurality of first phase-shifts may include a plurality of coarse phase-shifts, and/or the plurality of second phase-shifts may include a plurality of fine phase-shifts, e.g., as described below.

In some demonstrative aspects, the plurality of coarse phase-shifts may include relatively large or wide phase shifts, e.g., compared to the plurality of fine phase-shifts, and/or the plurality of fine phase-shifts may include relatively small or narrow phase shifts, e.g., compared to the plurality of coarse phase-shifts, e.g., as described below.

In other aspects, the plurality of first phase-shifts and/or the plurality of second phase-shifts may include any other suitable phase-shifts.

In some demonstrative aspects, phase generator 322 may be configured to generate a plurality of first phase-shifted signals by applying the plurality of first phase-shifts to the input frequency signal 343, e.g., as described below.

In some demonstrative aspects, phase generator 322 may be configured to generate the plurality of phase-shifted signal groups 324, for example, by applying the plurality of second phase-shifts to the plurality of first phase-shifted signals, e.g., as described below.

In some demonstrative aspects, as shown in FIG. 3, digitally-controlled frequency multiplier 340 may include a plurality of Digital Clock Multipliers (DCMs) 350, which may be controllable, for example, according to the digital control input 342, to generate a respective plurality of frequency-multiplied signals 326, for example, based on the plurality of phase-shifted signal groups 324, e.g., as described below.

In some demonstrative aspects, a frequency of the frequency-multiplied signals 326 may be based on a product of the input frequency and a count of a plurality of second phase-shifts, e.g., as described below.

In some demonstrative aspects, as shown in FIG. 3, digitally-controlled frequency multiplier 340 may include a combiner 328 to generate the output frequency signal 346, for example, based on a combination of the plurality of frequency-multiplied signals 326, e.g., as described below.

In some demonstrative aspects, as shown in FIG. 3, a DCM 350 of the plurality of DCMs 350 may be configured to generate a frequency-multiplied signal 326, for example, based on the phase-shifted signal group 324, e.g., as described below.

In some demonstrative aspects, as shown in FIG. 3, the DCM 350 may include a plurality of multiplier arrays 354 corresponding to the plurality of phase-shifted signals in the phase-shifted signal group 324, e.g., as described below.

In some demonstrative aspects, a multiplier array 354 may include a plurality of multipliers to be applied to a phase-shifted signal in the phase-shifted signal group 324, e.g., as described below.

In some demonstrative aspects, as shown in FIG. 3, DCM 350 may include a combiner 356 to generate the frequency-multiplied signal 326 of the DCM 350, for example, based on a combination of outputs 355 of the plurality of multiplier arrays 354 of the DCM 350, e.g., as described below.

In some demonstrative aspects, the plurality of multiplier arrays 354 may include a plurality of pairs of differential multiplier arrays, e.g., as described below.

In some demonstrative aspects, a pair of differential multiplier arrays may be configured to be applied to a pair of phase-shifted signals in the phase-shifted signal group 324, e.g., as described below.

In some demonstrative aspects, a multiplier array 354 may include a unit multiplier array including a plurality of unit multipliers, e.g., as described below.

In other aspects, the multiplier array may include any other type of multipliers.

In some demonstrative aspects, a multiplier of the plurality of multipliers may include a cascade switched-capacitor Power Amplifier (PA) cell, e.g., as described below.

In some demonstrative aspects, a multiplier of the plurality of multipliers may include a tri-state PA, e.g., as described below.

In other aspects the plurality of multipliers may include any other type of multiplier and/or PA.

In some demonstrative aspects, the digital control input 342 may include gain-control bit information, e.g., as described below.

In some demonstrative aspects, gains of the plurality of multiplier arrays 354 may be controllable, for example, according to the gain-control bit information in the digital control input 342, e.g., as described below.

In some demonstrative aspects, the digital control input 342 may include phase-select bit information, e.g., as described below.

In some demonstrative aspects, as shown in FIG. 3, DCM 350 may include plurality of switches 352, which may be controllable according to the phase-select bit information in the digital control input 342, for example, to selectively provide the plurality of phase-shifted signals of the phase-shifted signal group 324 to the plurality of multiplier arrays 354, e.g., as described below.

In some demonstrative aspects, as shown in FIG. 3, apparatus 301 may include a controller 304 configured to generate the digital control input 342, for example, based on the input frequency of input frequency signal 343, and/or the output frequency of output frequency signal 346, e.g., as described below.

In some demonstrative aspects, controller 304 may be configured to set the digital control input 342, for example, based on a setting of the output frequency of output frequency signal 346, e.g., as described below.

In some demonstrative aspects, the output frequency of output frequency signal 346 may include the input frequency of input frequency signal 343 multiplied by a frequency-multiplication factor, e.g., as described below.

In some demonstrative aspects, the frequency-multiplication factor may be based on a product of a count of the plurality of first phase-shifts and the count of the plurality of second phase-shifts, e.g., as described below. For example, the frequency-multiplication factor may be based on a product of a count of the plurality of coarse phase-shifts and the count of the plurality of fine phase-shifts, e.g., as described below.

In some demonstrative aspects, the frequency-multiplication factor may be an integer value, e.g., as described below.

In some demonstrative aspects, the frequency-multiplication factor may be a non-integer value, e.g., as described below.

In some demonstrative aspects, the frequency-multiplication factor may have any other value.

Figure 4:
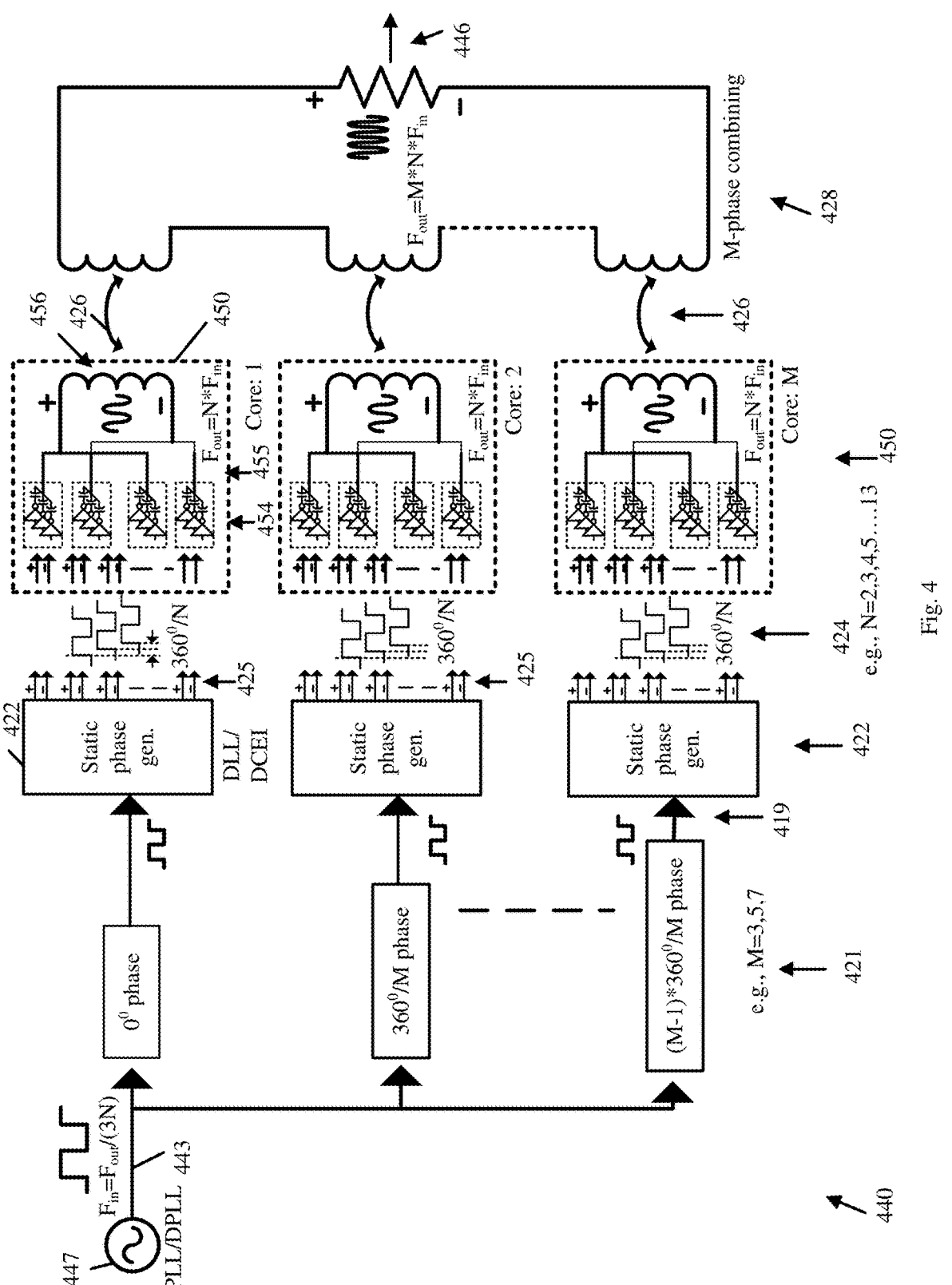
FIG. 4 is a schematic illustration of a digitally-controlled frequency multiplier, in accordance with some demonstrative aspects.

Reference is made to FIG. 4, which schematically illustrates a digitally-controlled frequency multiplier 440, in accordance with some demonstrative aspects. For example, digitally-controlled frequency multiplier 140 (FIG. 1) and/or digitally-controlled frequency multiplier 340 (FIG. 3) may include one or more elements of digitally-controlled frequency multiplier 440, and/or may perform one or more operations and/or functionalities of digitally-controlled frequency multiplier 440.

In some demonstrative aspects, as shown in FIG. 4, digitally-controlled frequency multiplier 440 may be controllable, according to a digital control input, e.g., digital control input 324 (FIG. 3), to generate an output frequency signal 446 having an output frequency, for example, by multiplying an input frequency of an input frequency signal 443, e.g., as described below. For example, input frequency signal 443 may be generated by a PLL 447, e.g., as described below.

In some demonstrative aspects, as shown in FIG. 4, digitally-controlled frequency multiplier 440 may include a phase generator 422 configured to generate a plurality of phase-shifted signal groups 424 corresponding to a respective plurality of first, e.g., coarse, phase-shifts 421 applied to the input frequency signal 443.

In some demonstrative aspects, as shown in FIG. 4, phase generator 422 may be configured to generate a plurality of first, e.g., coarse, phase-shifted signals 419 by applying the plurality of first, e.g., coarse, phase-shifts 421 to the input frequency signal 443, and to generate the plurality of phase-shifted signal groups 424, for example, by applying a plurality of second, e.g., fine, phase-shifts to the plurality of first, e.g., coarse, phase-shifted signals 419.

In some demonstrative aspects, as shown in FIG. 4, a phase-shifted signal group 424 corresponding to a first, e.g., coarse, phase-shift 421 may include a plurality of phase-shifted signals 425, for example, based on a respective plurality of second, e.g., fine, phase-shifts, e.g., as described below.

In some demonstrative aspects, as shown in FIG. 4, digitally-controlled frequency multiplier 440 may include a plurality of DCMs 450, which may be controllable, for example, according to the digital control input, to generate a respective plurality of frequency-multiplied signals 426, for example, based on the plurality of phase-shifted signal groups 424.

In some demonstrative aspects, a frequency of the frequency-multiplied signals 426 may be based on a product of the input frequency of the input frequency signal 443 and a count of the plurality of second, e.g., fine, phase-shifts applied by phase generator 422.

In some demonstrative aspects, as shown in FIG. 4, digitally-controlled frequency multiplier 440 may include a combiner 428 configured to generate the output frequency signal 446 based, for example, on a combination of the plurality of frequency-multiplied signals 426, e.g., as described below.

In some demonstrative aspects, as shown in FIG. 4, a DCM 450 of the plurality of DCMs 450 may be configured to generate a frequency-multiplied signal 426, for example, based on the phase-shifted signal group 424 provided to the DCM 450, e.g., as described below.

In some demonstrative aspects, as shown in FIG. 4, the DCM 450 may include a plurality of multiplier arrays 454 corresponding to the plurality of phase-shifted signals 425 in the phase-shifted signal group 424, e.g., as described below.

In some demonstrative aspects, a multiplier array 454 may include a plurality of multipliers to be applied to a phase-shifted signal 425 in the phase-shifted signal group 424, e.g., as described below.

In some demonstrative aspects, as shown in FIG. 4, the DCM 450 may include a combiner 456 to generate the frequency-multiplied signal 426 of the DCM 450, for example, based on a combination of outputs 455 of the plurality of multiplier arrays 454 of the DCM 450, e.g., as described below.

In some demonstrative aspects, as shown in FIG. 4, digitally-controlled frequency multiplier 440 may be implemented by three blocks. For example, digitally-controlled frequency multiplier 440 may include a phase generator block, e.g., phase generator 422, an LO multiplier block, e.g., DCMs 450, and/or an M-combiner block, e.g., combiner 428.

In some demonstrative aspects, phase generator 422 may include an edge-interpolator, for example, to generate phase offsets of the first, e.g., coarse, phase-shifted signals 419.

In some demonstrative aspects, the phase-offsets of the first, e.g., coarse, phase-shifted signals 419 may be static, for example, compared to phase modulation.

In one example, a PLL center frequency of PLL 447 may be 4 GHz, e.g., Fin=4 GHz, and may be varied in a range between 3 GHz-5 GHz.

In one example, the output frequency signal 446 may be configured for a mmWave frequency, for example, 120 GHz, e.g., Fout=120 GHz.

In one example, digitally-controlled frequency multiplier 440 may be implemented with a three-phase combining, e.g., the number of DCMs 450 may be 3 (M=3).

For example, a count, denoted N, of phase-shifted signals 425 in the plurality of phase-shifted signals 425 may be determined as N=10 (MN=120/4=4*3*10/4), for example, in case each edge interpolator is implemented to receive a phase shifted LO signal shifted by 120 degrees in the input frequency of 4 GHz.

In other aspects, any other input frequency Fin, any other output frequency Fout, any other count (M) of DCMs, and/or any other count (N) of phase-shifted signals 425 may be implemented.

In some demonstrative aspects, as shown in FIG. 4, phase generator 422 may be configured, e.g., using DCEI, to generate three 120° phase-shifted LO clock signals 421, e.g., when M=3.

In some demonstrative aspects, input signal 443 may include a constant phase LO, e.g., when digitally-controlled frequency multiplier 440 is implemented as an LO multiplier.

In some demonstrative aspects, input signal 443 may include a modulated signal, e.g., when digitally-controlled frequency multiplier 440 is implemented as a digital PA, e.g., a polar PA.

In some demonstrative aspects, as shown in FIG. 4, the three phases of the plurality of phase-shifted signals 419 may be processed by a phase generator block, e.g., a phase generator 422, which may be configured to generate a plurality of phases, e.g., phased apart by 360/N degrees.

In one example, a phase generator 422, which may be configured to generate 20 phases phased apart at 18°, e.g., for differential implementation. In other aspects, any other number of phases may be implemented.

In one example, the plurality of phases 425 may undergo through the plurality of DCMs 450.

In some demonstrative aspects, a DCM 450 may include some minimum sized logic, followed by a driver chain and a unit multiplier cell, e.g., as described below.

In some demonstrative aspects, the phase offset applied by phase 422 generator may be configured to ensure, for example, that only one current path may be existed from a P-channel Metal-Oxide-Semiconductor (MOS) (PMOS) through load to an N-channel MOS (NMOS), e.g., for a time duration equivalent to a 360/N phase difference, e.g., an 18-dgree phase difference, for example, at the input frequency of 4 GHz.

In some demonstrative aspects, as shown in FIG. 4, RF outputs of the three cores, e.g., frequency-multiplied signals 426 from the three DCMS 450, may be combined (series/parallel) by combiner 428, for example, to generate output frequency signal 446 as a third-harmonic output of each output of the cores.

In some demonstrative aspects, an overall output power of the output frequency signal 446 may be based, for example, on an impedance presented through the combiner 428.

In some demonstrative aspects, digitally-controlled frequency multiplier 440 may be configured to provide a technical solution to support frequency multiplication for a wide range of multiplication ratios, e.g., any multiplication ratio.

In some demonstrative aspects, digitally-controlled frequency multiplier 440 may implement gain and/or phase control mechanisms, for example, in conjunction with frequency control, for example, to support implementation of digitally-controlled frequency multiplier 440 a digital PA, for example, a digital poplar PA, e.g., a direct digital polar up-converting PA.

In some demonstrative aspects, an architecture of digitally-controlled frequency multiplier 440 may be implemented to provide a technical solution to support a scalable frequency multiplier. For example, a multiplication factor may be scalable to provide extremely high frequency clocks, for example, by stacking a plurality of M cascade devices, e.g., 3 cores of digitally-controlled frequency multiplier 440 or any other number of frequency multiplier cores.

Figure 5:
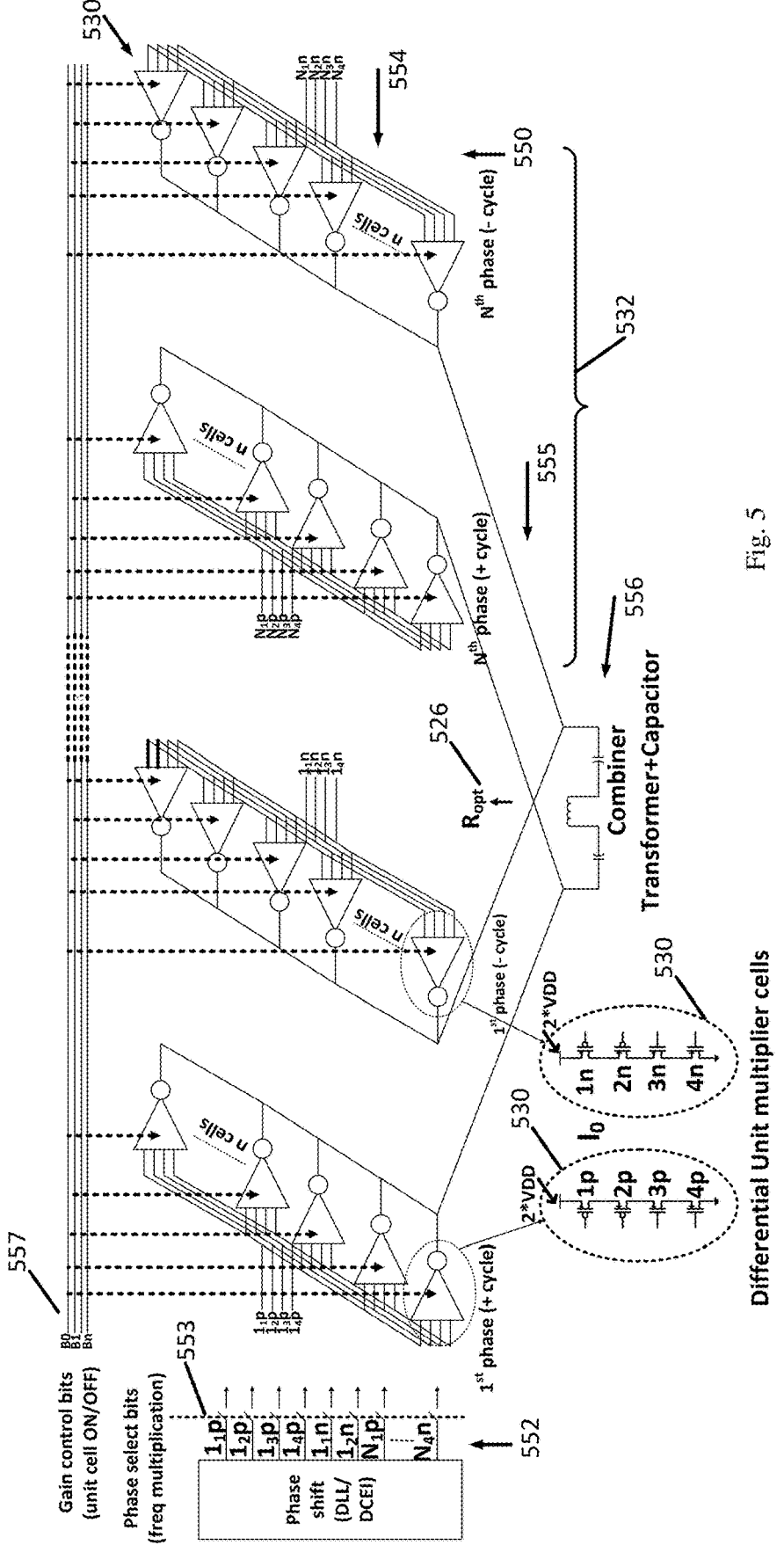
FIG. 5 is a schematic illustration of a Digital Clock Multiplier (DCM), in accordance with some demonstrative aspects.

Reference is made to FIG. 5, which schematically illustrates a DCM 550, in accordance with some demonstrative aspects. For example, DCM 150 (FIG. 1), DCM 350 (FIG. 3), and/or DCM 450 (FIG. 4), may include one or more elements of DCM 550, and/or may perform one or more operations of DCM 550.

In some demonstrative aspects, DCM 550 may be controllable, e.g., according to a digital control input to generate a frequency-multiplied signal 526 based, for example, on a phase-shifted signal group, e.g., phase-shifted signal group 524 (FIG. 5).

In some demonstrative aspects, as shown in FIG. 5, the digital control input may include phase-select bit information 553, e.g., as described below.

In some demonstrative aspects, as shown in FIG. 5, the digital control input may include gain-control bit information 557, e.g., as described below.

In some demonstrative aspects, as shown in FIG. 5, the DCM 550 may include a plurality of multiplier arrays 554 corresponding to a plurality of phase-shifted signals in the phase-shifted signal group.

In some demonstrative aspects, as shown in FIG. 5, the plurality of multiplier arrays 554 may include a plurality of pairs 532 of differential multiplier arrays.

In some demonstrative aspects, as shown in FIG. 5, a pair 532 of differential multiplier arrays may be configured to be applied to a pair of phase-shifted signals in the phase-shifted signal group.

In some demonstrative aspects, as shown in FIG. 5, a multiplier array 550 may include a plurality of multipliers 530 to be applied to a phase-shifted signal in the phase-shifted signal group, e.g., as described below.

In some demonstrative aspects, the multiplier array 550 may include a unit multiplier array including a plurality of unit multipliers 530.

In other aspects, the multiplier array may include any other type of multipliers.

In some demonstrative aspects, a multiplier 530 of the plurality of multipliers 530 may include a cascade switched-capacitor PA cell.

In some demonstrative aspects, a multiplier 530 of the plurality of multipliers may include a tri-state PA.

In one example, a unit multiplier cell, e.g., a multiplier 530, may include a cascade switched-capacitor PA cell with tri-state capability.

In other aspects, a multiplier 530 of the plurality of multipliers 530 may include any other type of PA or multiplier.

In some demonstrative aspects, as shown in FIG. 5, the DCM 550 may include a combiner 556 to generate the frequency-multiplied signal 526, for example, based on a combination of outputs 555 of the plurality of multiplier arrays 554, e.g., as described below.

In some demonstrative aspects, as shown in FIG. 5, DCM 550 may include plurality of switches 552, which may be controllable according to the phase-select bit information 553 in the digital control input, for example, to selectively provide the plurality of phase-shifted signals of the phase-shifted signal group to the plurality of multiplier arrays 554.

In some demonstrative aspects, the gain-control bit information 557 in the digital control input may be configured to control gains of the plurality of multiplier arrays 554.

In some demonstrative aspects, gain-control bit information 557 may be configured for gain control of the plurality of multiplier arrays 554, e.g., when a digitally-controlled frequency multiplier including the DCM 550 is implemented as a multiplier.

In some demonstrative aspects, gain-control bit information 557 may be configured for amplitude modulation, e.g., when a digitally-controlled frequency multiplier including the DCM 550 is implemented as a digital PA, e.g., a polar PA.

In one example, the gain control may be achieved, for example, by controlling how many unit cells, e.g., amplifiers 530, are active, e.g., in a same phase path.

Figure 6:
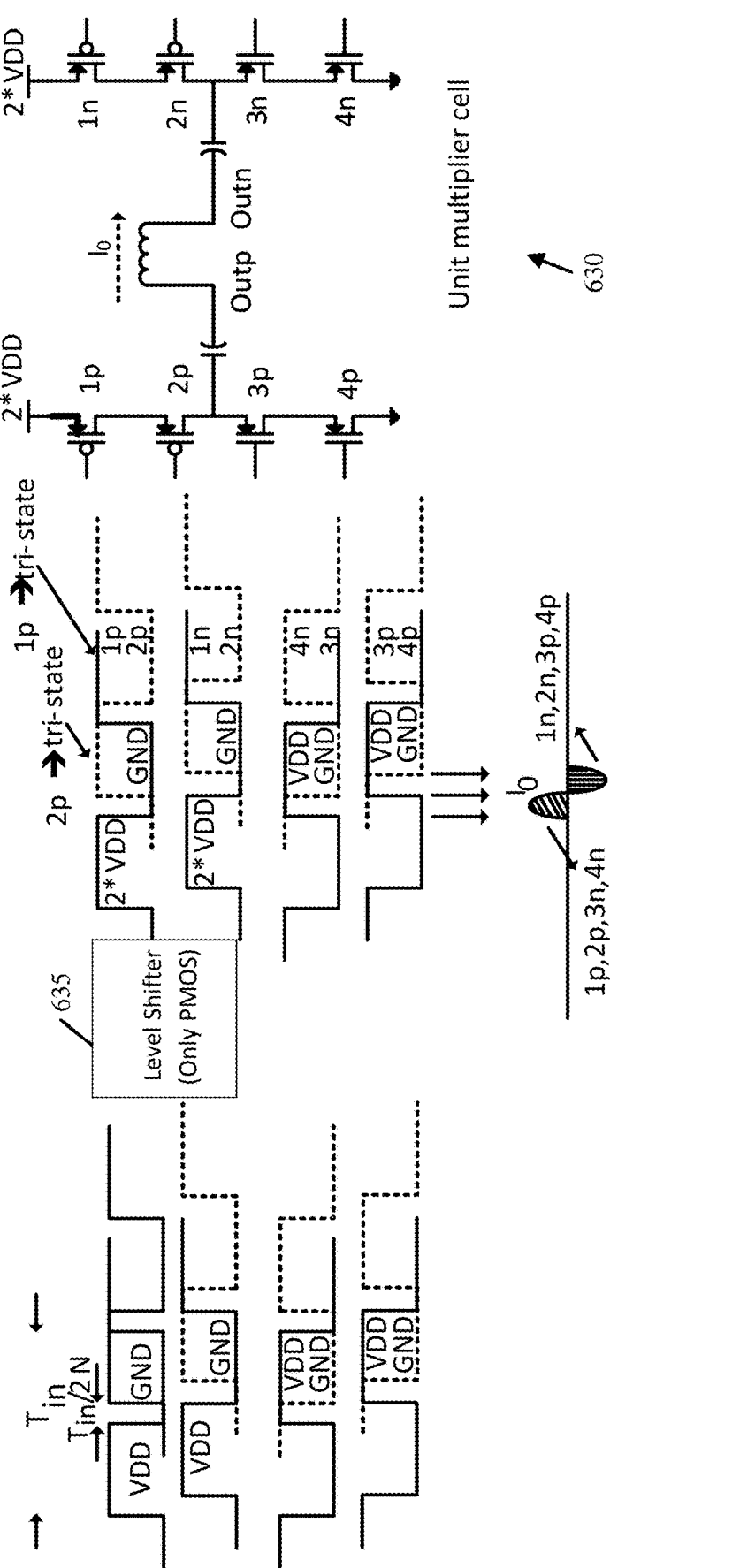
FIG. 6 is a schematic illustration of a multiplier and signals multiplied by the multiplier, in accordance with some demonstrative aspects.

Reference is made to FIG. 6, which schematically illustrates a multiplier 630 and signals multiplied by the multiplier 630, in accordance with some demonstrative aspects.

For example, multiplier 530 (FIG. 5) may include one or more elements of multiplier 630, and/or may perform one or more operations and/or functionalities of multiplier 630.

In some demonstrative aspects, as shown in FIG. 6, multiplier 630 may include a cascade switched-capacitor PA cell with tri-state capability.

In some demonstrative aspects, as shown in FIG. 6, multiplier 630 may include Tri-state PMOS cells and Tri-state NMOS cells, which may be configured to allow shorting multiple unit cells, which may be driven, for example, by the same phase LO clocks.

In some demonstrative aspects, as shown in FIG. 6, the LO clocks may be at an input frequency of 4 GHz. For example, as shown in FIG. 6, current may flow through a pair of differential devices, e.g., a pair 532 (FIG. 5), for example, only during a tenth of a duration of a whole period of the LO clocks, for example, when considering both positive cycle and negative cycle of current flow This may result in a multiplication factor of 10.

In some demonstrative aspects, as shown in FIG. 6, during other times, e.g., during 9/10 of the period of the LO clocks, there may be no current path through the same pair of the differential devices, e.g., pair 532 (FIG. 5), for example, due to a tri-state mode of the unit cells of multiplier 630.

In one example, the unit cells include driver chains, for example, with a fan-out ratio of r:1 (r~3). In another example, any other fan-out ratio may be implemented.

In some demonstrative aspects, as shown in FIG. 6, multiplier 630 may include a level shifter 635 configured to ensure that no unit cell exceeds a rated Gate-Source Voltage $(V_{GS})$, e.g., at any condition.

Figure 7:
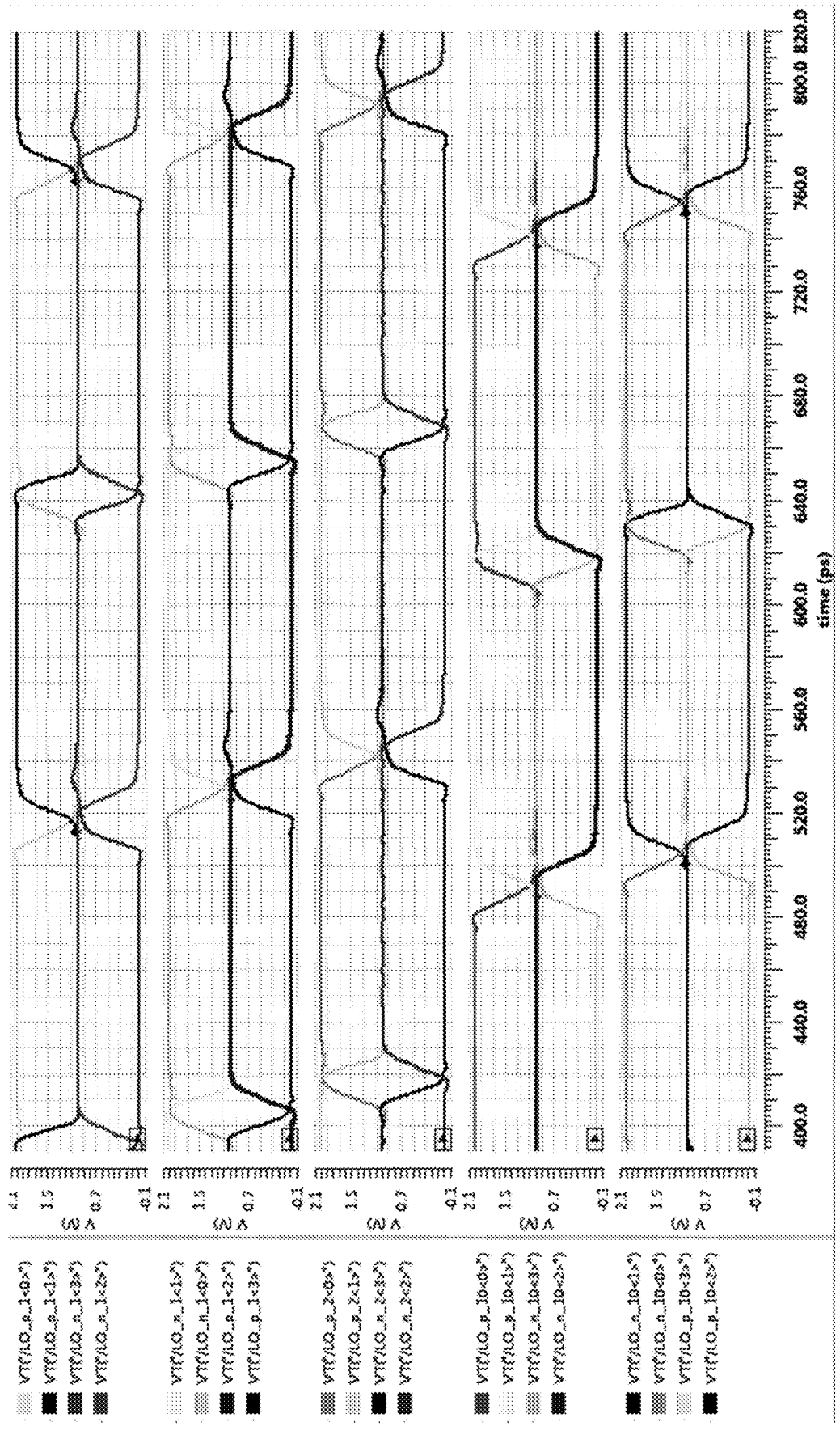
FIG. 7 is a schematic illustration of a graph depicting a plurality of gate signals of a plurality of multipliers of a DCM, in accordance with some demonstrative aspects.

Reference is made to FIG. 7, which schematically illustrates a graph 700 depicting a plurality of gate signals of a plurality of multipliers of a DCM, in accordance with some demonstrative aspects.

In one example, the graph of FIG. 7 is based on a cadence test simulated in 16FF CMOS, with real devices, driver chain, gain and phase control logic, Electro Magnetic (EM) model of the combiner and capacitor, with phase generation through a Verilog model.

For example, a phase generator, e.g., phase generator 322 (FIG. 3), may be configured to generate a plurality of phase-shifted signals, for example, 12 phase signals, e.g., including the phases of FIG. 7.

In some demonstrative aspects, the gate signals of the plurality of multipliers of the DCM may be provided through a pair of differential multiplier arrays, for example, during every phase of 180 degrees.

In one example, graph 700 depicts phases for the unit cells 1,2,3,9 and 10 of the unit cells of multiplier 630 (FIG. 6), while phases of other unit cells are omitted for better clarity.

In one example, gate signals for the PMOS devices have been shifted, for example, in order to maintain a maximum 1V voltage stress on the unit cells.

Figure 8:
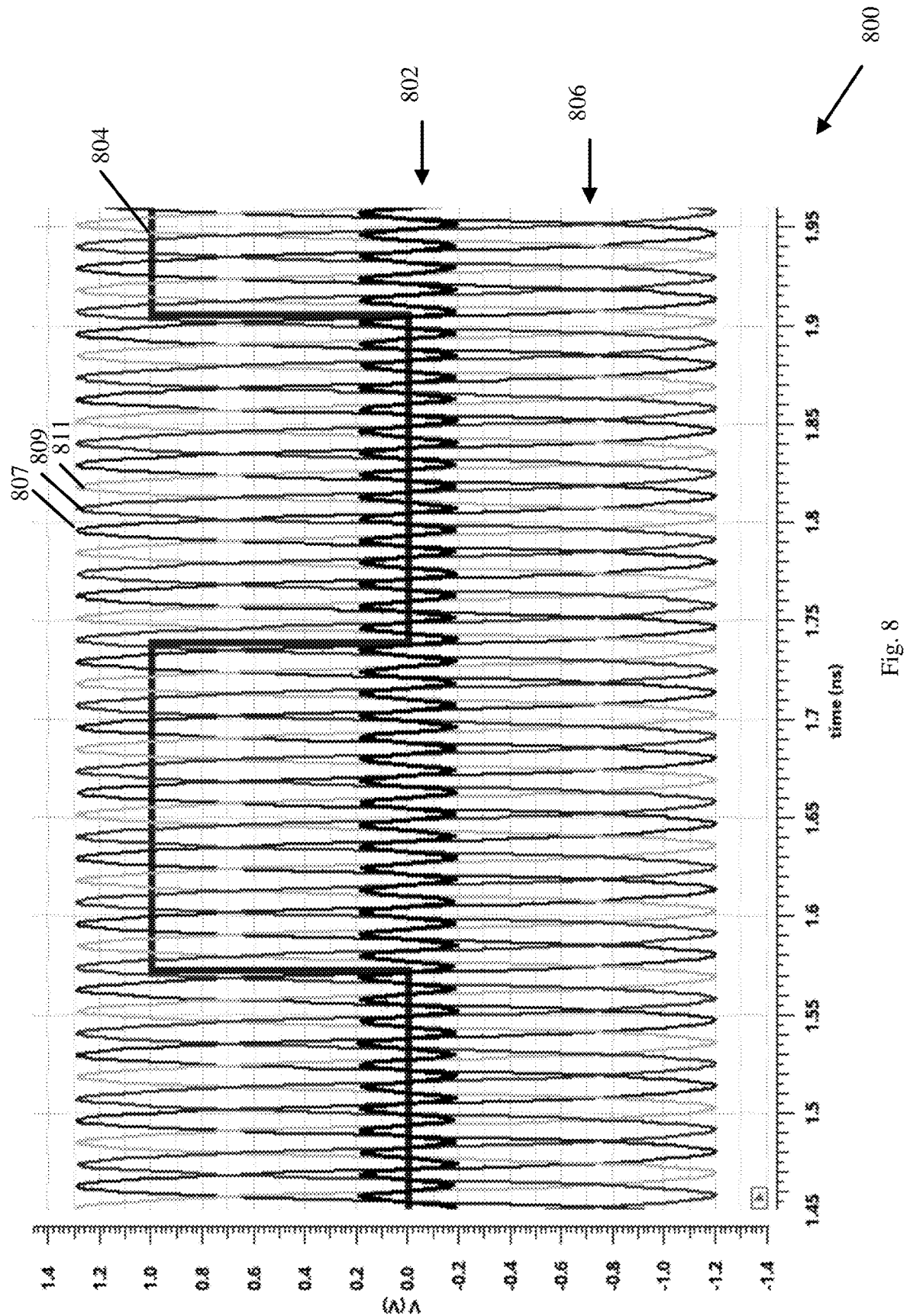
FIG. 8 is a schematic illustration of a graph depicting an output frequency signal of a digitally-controlled frequency multiplier, in accordance with some demonstrative aspects.

Reference is made to FIG. 8, which schematically illustrates a graph 800 depicting an output frequency signal 802 of a digitally-controlled frequency multiplier, in accordance with some demonstrative.

In some demonstrative aspects, output signal 802 may include an output signal of combiner 328 (FIG. 3) and/or combiner 428 (FIG. 4).

In some demonstrative aspects, as shown in FIG. 8, output signal 802 may be generated based an input frequency of an input signal 804. For example, input signal 804 may include input frequency signal 343 (FIG. 3) or input frequency signal 443 (FIG. 4).

In some demonstrative aspects, as shown in FIG. 8, an output frequency of output signal 802 may be based on a frequency multiplication of an input frequency of input signal 804, e.g., by a frequency multiplication factor of 30.

In some demonstrative aspects, as shown in FIG. 8, an output frequency of output signal 802 may be based on a combination of output DCM signals 806 of a plurality of DCMs. For example, output DCM signals 806 may include DCM output signals 326 (FIG. 3) provided by the plurality of DCMs 350 (FIG. 3).

In some demonstrative aspects, as shown in FIG. 8, the output DCM signals 806 may include three output DCM signals, e.g., an output DCM signal 807 of a first DCM, an output DCM signal 809 of a second DCM, and an output DCM signal 811 of a third DCM.

In some demonstrative aspects, as shown in FIG. 8, the output DCM signals 807, 809 and 811 may be shifted in time with respect to one another.

In some demonstrative aspects, as shown in FIG. 8, a frequency of each of the output DCM signals 807, 809 and 811 may be based on a frequency multiplication of an input frequency of input signal 804, e.g., by a factor of 10.

Figure 9:
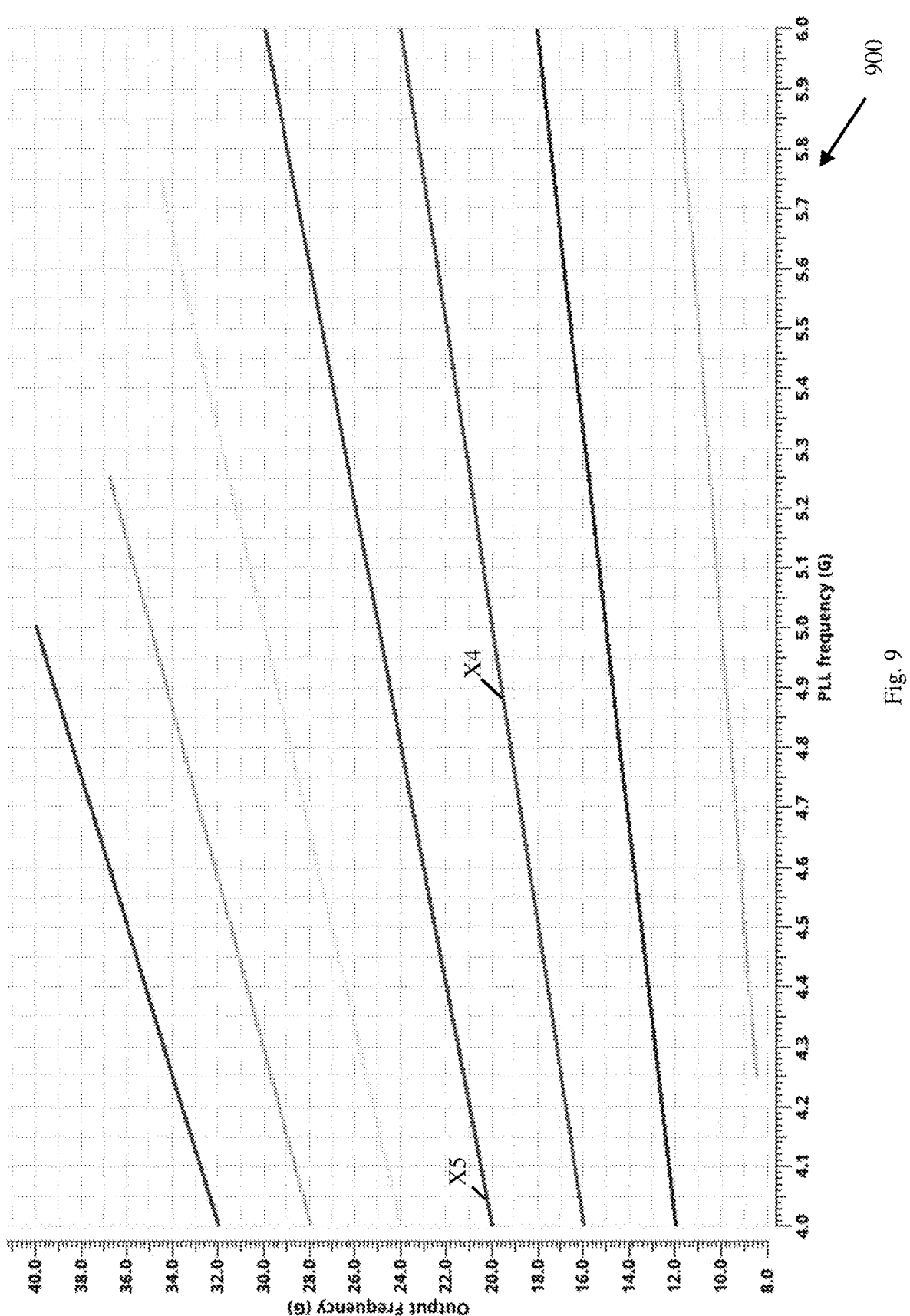
FIG. 9 is a schematic illustration of a graph depicting an output frequency versus an input frequency of a digitally-controlled frequency multiplier according to a plurality of frequency multiplier settings, in accordance with some demonstrative aspects.

Reference is made to FIG. 9, which schematically illustrates a graph 900 depicting a plurality of curves representing an output frequency versus an input frequency (PLL frequency) of a digitally-controlled frequency multiplier according to a plurality of frequency multiplier settings, in accordance with some demonstrative.

For example, the plurality of curves of FIG. 9 may be generated based on a simulation of a frequency tunning range of the digitally-controlled frequency multiplier, for example, using multiple settings of digital configuration bits of the digitally-controlled frequency multiplier, e.g., between zero and a full range.

In one example, the plurality of curves of FIG. 9 may be generated based on a simulation assuming that a PLL may provide the input frequency with a frequency tuning capacity of 2 GHz, e.g., corresponding to a fractional bandwidth of approximately 25%.

For example, as shown in FIG. 9, the input frequency may be controllably tuned in a range between about 4 GHz and about 6 GHz. In other aspects, any other additional or alternative input frequencies may be implemented.

In one example, one or more curves of graph 900 may be based on the output frequency of the output frequency signal 346 (FIG. 3), which may be generated by digitally-controlled frequency multiplier 340 (FIG. 3), as a function of the input frequency of input signal 343 (FIG. 3), for example, according to one or more frequency multiplier settings of digitally-controlled frequency multiplier 340 (FIG. 3).

In some demonstrative aspects, as shown in FIG. 9, the output frequency may be controllably tuned in a range between about 9 GHz and about 40 GHz, for example, according to a plurality of multiplication factors, e.g., in a range between about two and about ten. In other aspects, any other additional or alternative multiplication factors may be implemented to support any other additional or alternative output frequencies.

In some demonstrative aspects, as shown in FIG. 9, an output frequency, e.g., substantially any output frequency, in the range between about 9 GHz and about 40 GHz, may be achieved according to a settings of one or more combination of an input frequency and a multiplication factor.

In some demonstrative aspects, as shown in FIG. 9, there may be two or more alternative combinations of an input frequency and a multiplication factor, which may be used to achieve substantially the same output frequency.

In one example, an output frequency of 20 GHz may be achieved by a combination of an input frequency of 4 GHz and a multiplication factor of 5. In another example, the output frequency of 20 GHz may be achieved by a combination of an input frequency of 5 GHz and a multiplication factor of 4.

In some demonstrative aspects, a digitally-controlled frequency multiplier, e.g., digitally-controlled frequency multiplier 340 (FIG. 3) may be configured to support a wide range of frequency multiplication factors, e.g., with substantially no theoretical limitation on a maximum multiplication factor. However, in some cases an extremely high multiplication factor may cause some undesired effects, e.g., poor phase noise, jitter and/or crowbar current.

In some cases, an extremely shallow pulse may possibly result in some timing issues, which may cause undesired harmonic spurs. For example, these harmonic spurs may have an effect on an analog Tx/Rx chain, for example, due to intermodulation.

Figure 10:
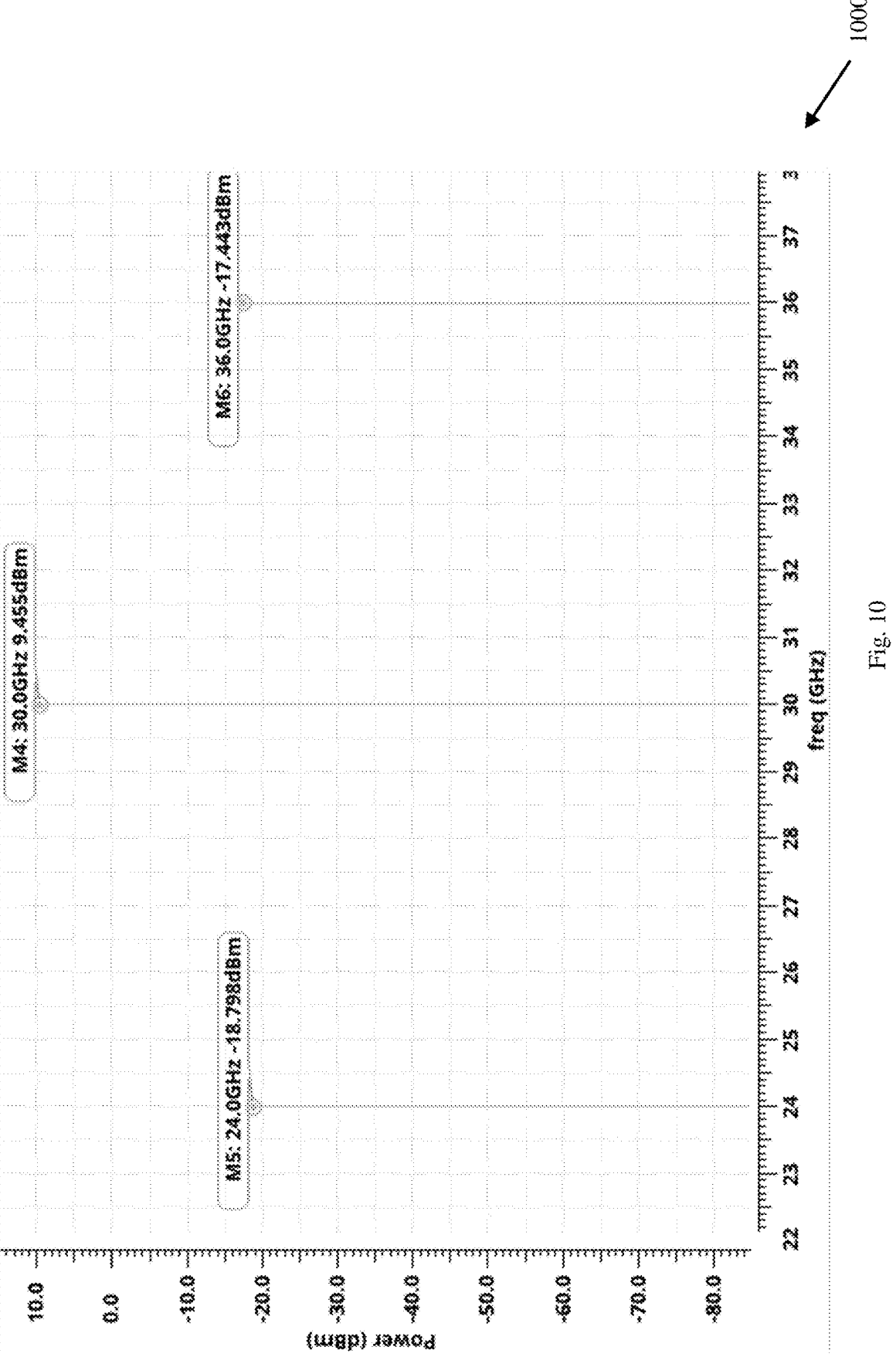
FIG. 10 is a schematic illustration of a graph depicting an output power of a digitally-controlled frequency multiplier, in accordance with some demonstrative aspects.

Reference is made to FIG. 10, which schematically illustrates a graph 1000 depicting an output power of a digitally-controlled frequency multiplier, in accordance with some demonstrative.

In one example, power levels of graph 1000 may be based on simulated power levels of digitally-controlled frequency multiplier 340 (FIG. 3).

In some demonstrative aspects, as shown in FIG. 10, at an output frequency of 30 GHz, an output power of approximately 9.5 dBm may be achieved, e.g., with minimum optimization.

In some demonstrative aspects, as shown in FIG. 10, a suppression of approximately 26 dB relative to carrier (dBc) may be achieved, e.g., for harmonics.

In one example, a suitable optimization and/or harmonic trap may be used at a combiner, e.g., combiner 356 (FIG. 3), for example, to suppress the harmonics, e.g., even further.

Figure 11:
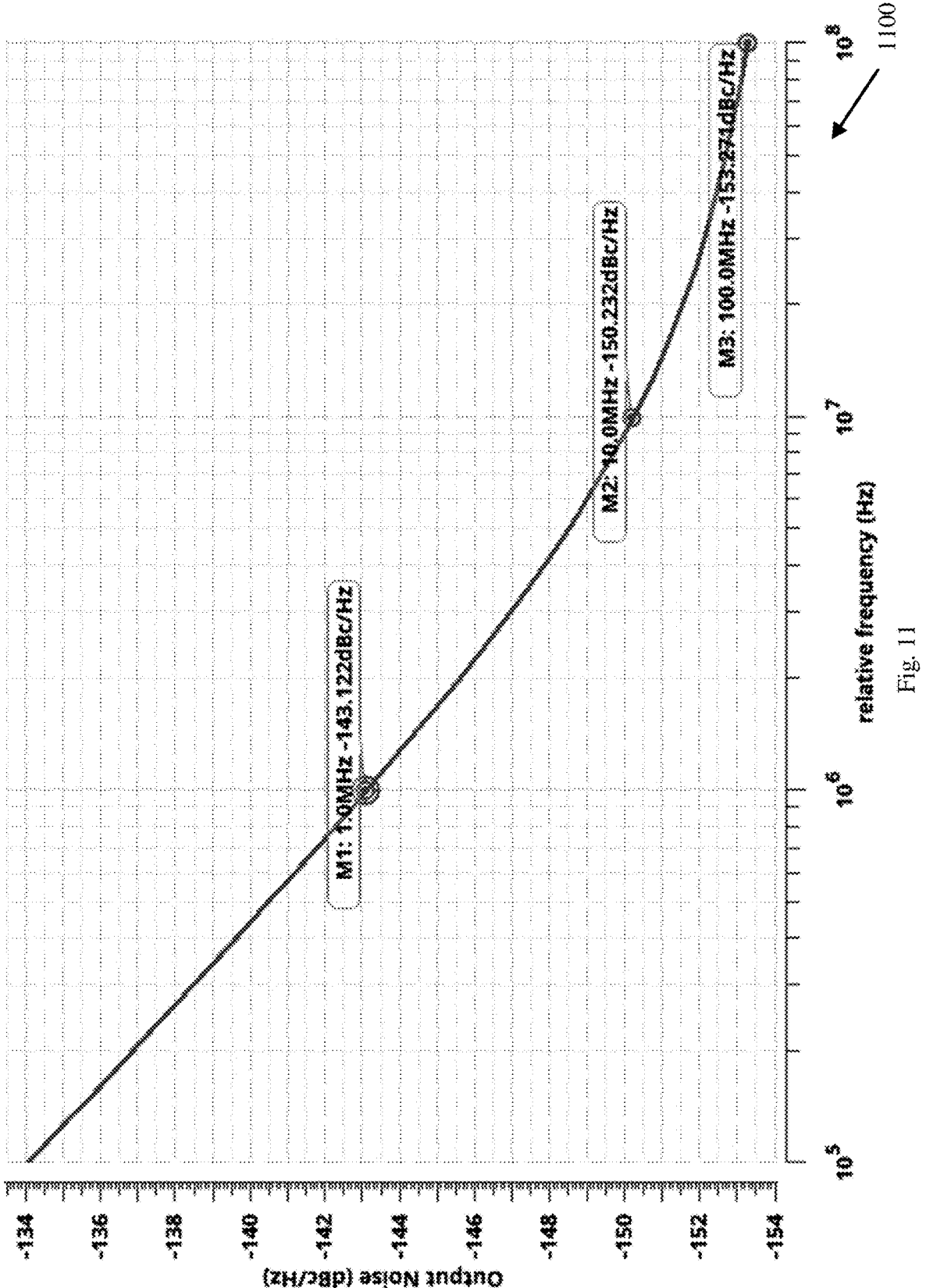
FIG. 11 is a schematic illustration of a graph depicting phase noise of an output signal of a digitally-controlled frequency multiplier, in accordance with some demonstrative aspects.

Reference is made to FIG. 11, which schematically illustrates a graph 1100 depicting phase noise of an output signal of a digitally-controlled frequency multiplier, in accordance with some demonstrative.

In one example, the phase noise of an output signal of graph 1100 may be based on simulated phase noise of output signal 346 (FIG. 3).

In one example, the phase noise may be closely related to efficiency. For example, a high drive strength buffer chain may be utilized to improve phase noise and/or jitter, e.g., at an expense of reducing efficiency.

In some demonstrative aspects, as shown in FIG. 11, a digitally-controlled frequency multiplier may be relatively stable to phase noise. For example, as shown in FIG. 11, a phase noise performance level of −150 dBc/Hz may be achieved, e.g., for a 10 MHz offset, and/or a performance level of −153 dBc/Hz may eb achieved, e.g., for a 100 MHz offset.

Figure 12:
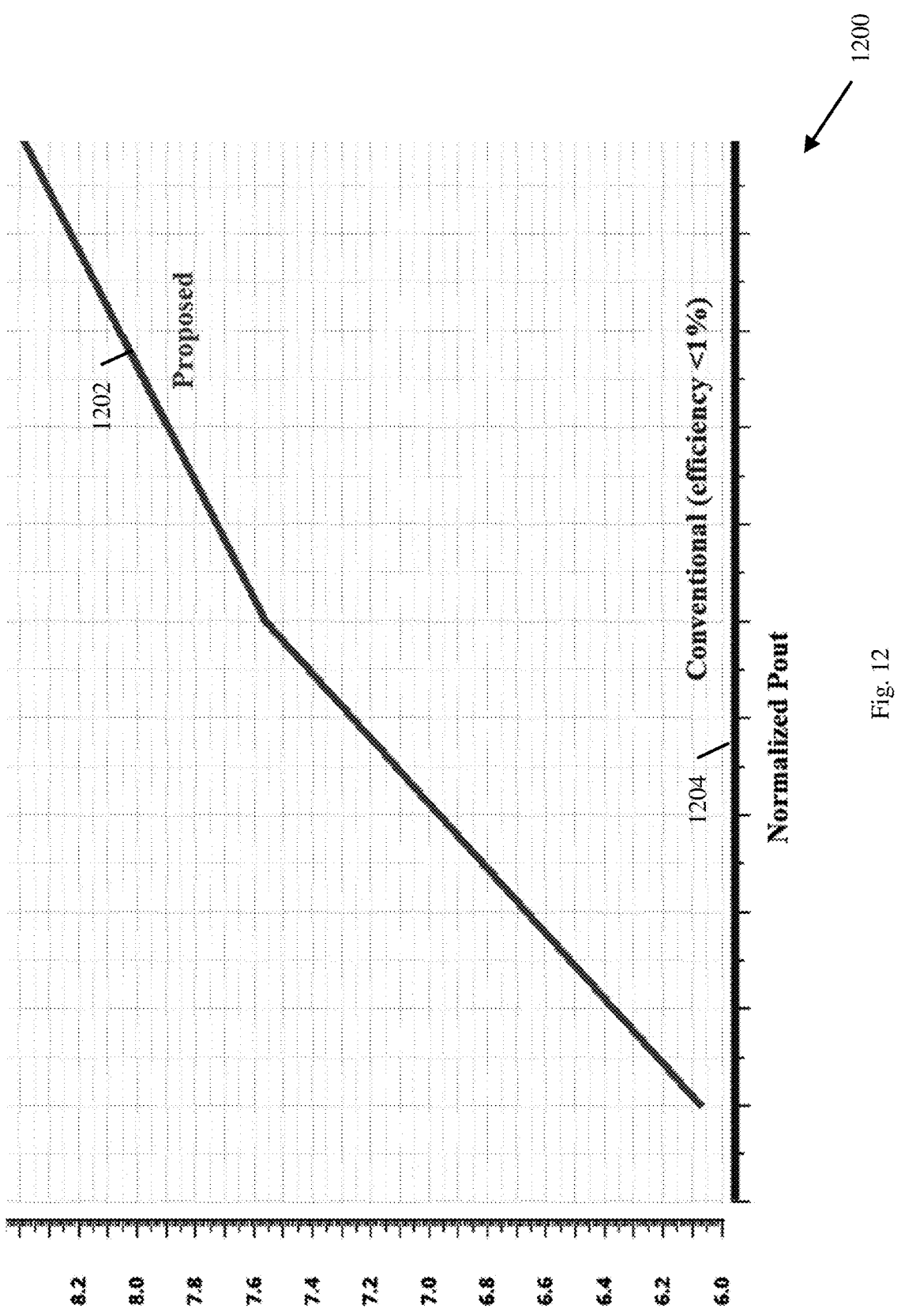
FIG. 12 is a schematic illustration of a graph depicting power efficiency of an output signal of a digitally-controlled frequency multiplier, in accordance with some demonstrative aspects.

Reference is made to FIG. 12, which schematically illustrates a graph 1200 depicting power efficiency curve 1202 of an output signal of a digitally-controlled frequency multiplier, in accordance with some demonstrative.

In one example, power efficiency curve 1202 may be based on simulation of the power efficiency of the output signal 346 (FIG. 3) of a digitally-controlled frequency multiplier 340 (FIG. 3).

In one example, a power efficiency curve 1204 may represent a power efficiency of some LO multipliers.

In some demonstrative aspects, as shown in FIG. 12, a digitally-controlled frequency multiplier, e.g.., as described herein, may be implemented to provide a technical solution with an efficiency of about 8.5%, e.g., without considering phase generation. This efficiency may be substantially higher, for example, compared to a power efficiency of the LO multipliers represented by curve 1204. For example, these LO multipliers may not offer any power gain at all, and, therefore, may have an extremely poor overall efficiency.

Figure 13:
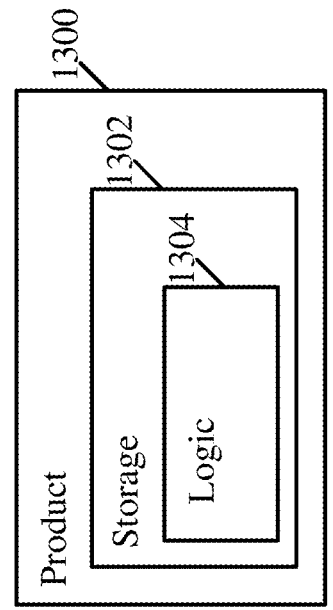
FIG. 13 is a schematic illustration of a product of manufacture, in accordance with some demonstrative aspects.

Reference is made to FIG. 13, which schematically illustrates a product of manufacture 1300, in accordance with some demonstrative aspects. Product 1300 may include one or more tangible computer-readable ("machine-readable") non-transitory storage media 1302, which may include computer-executable instructions, e.g., implemented by logic 1304, operable to, when executed by at least one computer processor, enable the at least one computer processor to implement one or more operations at device 102 (FIG. 1), digitally-controlled frequency multiplier 140 (FIG. 1), digitally-controlled frequency multiplier 340 (FIG. 3), digitally-controlled frequency multiplier 440 (FIG. 4), LO generator 130 (FIG. 1), and/or PA 136 (FIG. 1); to cause device 102 (FIG. 1), digitally-controlled frequency multiplier 140 (FIG. 1), digitally-controlled frequency multiplier 340 (FIG. 3), digitally-controlled frequency multiplier 440 (FIG. 4), LO generator 130 (FIG. 1), and/or PA 136 (FIG. 1) to perform, trigger and/or implement one or more operations and/or functionalities; and/or to perform, trigger and/or implement one or more operations and/or functionalities described with reference to the FIGS. 1-12, and/or one or more operations described herein. The phrases "non-transitory machine-readable medium" and "computer-readable non-transitory storage media" may be directed to include all machine and/or computer readable media, with the sole exception being a transitory propagating signal.

In some demonstrative aspects, product 1300 and/or machine-readable storage media 1302 may include one or more types of computer-readable storage media capable of storing data, including volatile memory, non-volatile memory, removable or non-removable memory, erasable or non-erasable memory, writeable or re-writeable memory, and the like. For example, machine-readable storage media 1302 may include, RAM, DRAM, Double-Data-Rate DRAM (DDR-DRAM), SDRAM, static RAM (SRAM), ROM, programmable ROM (PROM), erasable programmable ROM (EPROM), electrically erasable programmable ROM (EEPROM), flash memory (e.g., NOR or NAND flash memory), content addressable memory (CAM), polymer memory, phase-change memory, ferroelectric memory, silicon-oxide-nitride-oxide-silicon (SONOS) memory, a disk, a hard drive, and the like. The computer-readable storage media may include any suitable media involved with downloading or transferring a computer program from a remote computer to a requesting computer carried by data signals embodied in a carrier wave or other propagation medium through a communication link, e.g., a modem, radio or network connection.

In some demonstrative aspects, logic 1304 may include instructions, data, and/or code, which, if executed by a machine, may cause the machine to perform a method, process and/or operations as described herein. The machine may include, for example, any suitable processing platform, computing platform, computing device, processing device, computing system, processing system, computer, processor, or the like, and may be implemented using any suitable combination of hardware, software, firmware, and the like.

In some demonstrative aspects, logic 1304 may include, or may be implemented as, software, a software module, an application, a program, a subroutine, instructions, an instruction set, computing code, words, values, symbols, and the like. The instructions may include any suitable type of code, such as source code, compiled code, interpreted code, executable code, static code, dynamic code, and the like. The instructions may be implemented according to a predefined computer language, manner or syntax, for instructing a processor to perform a certain function. The instructions may be implemented using any suitable high-level, low-level, object-oriented, visual, compiled and/or interpreted programming language, machine code, and the like.

EXAMPLES

The following examples pertain to further aspects.

Example 1 includes an apparatus comprising a digitally-controlled frequency multiplier, controllable according to a digital control input, to generate an output frequency signal having an output frequency by multiplying an input frequency of an input frequency signal, the digitally-controlled frequency multiplier comprising a phase generator configured to generate a plurality of phase-shifted signal groups corresponding to a respective plurality of first phase-shifts applied to the input frequency signal, wherein a phase-shifted signal group corresponding to a first phase-shift comprises a plurality of phase-shifted signals based on a respective plurality of second phase-shifts; a plurality of Digital Clock Multipliers (DCMs) controllable according to the digital control input to generate a respective plurality of frequency-multiplied signals based on the plurality of phase-shifted signal groups, wherein a frequency of the frequency-multiplied signals is based on a product of the input frequency and a count of the plurality of second phase-shifts; and a combiner to generate the output frequency signal based on a combination of the plurality of frequency-multiplied signals.

Example 2 includes the subject matter of Example 1, and optionally, wherein a DCM of the plurality of DCMs is configured to generate a frequency-multiplied signal based on the phase-shifted signal group, the DCM comprising a plurality of multiplier arrays corresponding to the plurality of phase-shifted signals in the phase-shifted signal group, wherein a multiplier array comprises a plurality of multipliers to be applied to a phase-shifted signal in the phase-shifted signal group; and a combiner to generate the frequency-multiplied signal based on a combination of outputs of the plurality of multiplier arrays.

Example 3 includes the subject matter of Example 2, and optionally, comprising a plurality of switches, controllable according to phase-select bit information in the digital control input, to selectively provide the plurality of phase-shifted signals of the phase-shifted signal group to the plurality of multiplier arrays.

Example 4 includes the subject matter of Example 2 or 3, and optionally, wherein gains of the plurality of multiplier arrays are controllable according to gain-control bit information in the digital control input.

Example 5 includes the subject matter of any one of Examples 2-4, and optionally, wherein the plurality of multiplier arrays comprises a plurality of pairs of differential multiplier arrays, wherein a pair of differential multiplier arrays is configured to be applied to a pair of phase-shifted signals in the phase-shifted signal group.

Example 6 includes the subject matter of any one of Examples 2-5, and optionally, wherein a multiplier of the plurality of multipliers comprises a cascade switched-capacitor Power Amplifier (PA) cell.

Example 7 includes the subject matter of any one of Examples 2-6, and optionally, wherein a multiplier of the plurality of multipliers comprises a tri-state Power Amplifier (PA).

Example 8 includes the subject matter of any one of Examples 2-7, and optionally, wherein the multiplier array comprises a unit multiplier array comprising a plurality of unit multipliers.

Example 9 includes the subject matter of any one of Examples 1-8, and optionally, wherein the phase generator is configured to generate a plurality of first phase-shifted signals by applying the plurality of first phase-shifts to the input frequency signal, and to generate the plurality of phase-shifted signal groups by applying the plurality of second phase-shifts to the plurality of first phase-shifted signals.

Example 10 includes the subject matter of any one of Examples 1-9, and optionally, comprising a controller configured to generate the digital control input based on the input frequency and the output frequency.

Example 11 includes the subject matter of Example 10, and optionally, wherein the controller is configured to set the digital control input based on a setting of the output frequency.

Example 12 includes the subject matter of any one of Examples 1-11, and optionally, wherein the output frequency comprises the input frequency multiplied by a frequency-multiplication factor, wherein the frequency-multiplication factor is based on a product of a count of the plurality of first phase-shifts and the count of the plurality of second phase-shifts.

Example 13 includes the subject matter of Example 12, and optionally, wherein the frequency-multiplication factor is an-integer value.

Example 14 includes the subject matter of Example 12, and optionally, wherein the frequency-multiplication factor is a non-integer value.

Example 15 includes the subject matter of any one of Examples 1-14, and optionally, wherein the input frequency is at least 1 gigahertz (GHz).

Example 16 includes the subject matter of any one of Examples 1-15, and optionally, wherein the plurality of first phase-shifts includes a plurality of coarse phase-shifts, and the plurality of second phase-shifts includes a plurality of fine phase-shifts.

Example 17 includes the subject matter of any one of Examples 1-16, and optionally, comprising a Local Oscillator (LO) signal generator to generate the input frequency signal, and a frequency mixer driven by the output frequency signal.

Example 18 includes the subject matter of any one of Examples 1-16, and optionally, comprising a digital Power Amplifier (PA) to transmit a Radio Frequency (RF) signal via an antenna, the digital PA comprising the digitally-controlled frequency multiplier generate the output frequency signal comprising the RF signal based on the input frequency signal comprising a phase-modulated Local Oscillator (LO) signal.

Example 19 includes the subject matter of any one of Example 1-18, and optionally, comprising a Radio Frequency (RF) chain configured to process an RF signal based on the output frequency signal.

Example 20 includes the subject matter of Example 19, and optionally, comprising a wireless communication device comprising a processor to process wireless communication signals communicated by the RF chain.

Example 21 includes the subject matter of Example 19, and optionally, comprising a radar device, the radar device comprising a processor to generate radar information based on radar signals communicated by the RF chain.

Example 22 includes a radar device comprising the apparatus of any of Examples 1-21.

Example 23 includes a wireless communication device comprising the apparatus of any of Examples 1-21.

Example 24 includes a vehicle comprising the apparatus of any of Examples 1-21.

Example 25 includes an apparatus comprising means for executing any of the described operations of any of Examples 1-21.

Example 26 includes a machine-readable medium that stores instructions for execution by a processor to perform any of the described operations of any of Examples 1-21.

Example 27 comprises a product comprising one or more tangible computer-readable non-transitory storage media comprising computer-executable instructions operable to, when executed by at least one processor, enable the at least one processor to cause a device to perform any of the described operations of any of Examples 1-21.

Example 28 includes an apparatus comprising a memory; and processing circuitry configured to perform any of the described operations of any of Examples 1-21.

Example 29 includes a method including any of the described operations of any of Examples 1-21.

Functions, operations, components and/or features described herein with reference to one or more aspects, may be combined with, or may be utilized in combination with, one or more other functions, operations, components and/or features described herein with reference to one or more other aspects, or vice versa.

While certain features have been illustrated and described herein, many modifications, substitutions, changes, and equivalents may occur to those skilled in the art. It is, therefore, to be understood that the appended claims are intended to cover all such modifications and changes as fall within the true spirit of the disclosure.

What is claimed is:

1. An apparatus comprising:

a digitally-controlled frequency multiplier, controllable according to a digital control input, the digitally-controlled frequency multiplier configured to generate an output frequency signal having an output frequency, the digitally-controlled frequency multiplier configured to generate the output frequency signal by multiplying an input frequency of an input frequency signal, the digitally-controlled frequency multiplier comprising:

a phase generator configured to generate a plurality of phase-shifted signal groups corresponding to a respective plurality of first phase-shifts applied to the input frequency signal, wherein a phase-shifted signal group corresponding to a first phase-shift of the plurality of first phase-shifts comprises a plurality of phase-shifted signals based on a respective plurality of second phase-shifts;

a plurality of Digital Clock Multipliers (DCMs) controllable according to the digital control input to generate a respective plurality of frequency-multiplied signals based on the plurality of phase-shifted signal groups, wherein a frequency of the frequency-multiplied signals is based on a product of the input frequency and a count of the plurality of second phase-shifts; and a combiner to generate the output frequency signal based on a combination of the plurality of frequency-multiplied signals.

2. The apparatus of claim 1, wherein a DCM of the plurality of DCMs is configured to generate a frequency-multiplied signal based on the phase-shifted signal group, the DCM comprising:

a plurality of multiplier arrays corresponding to the plurality of phase-shifted signals in the phase-shifted signal group, wherein a multiplier array comprises a plurality of multipliers to be applied to a phase-shifted signal in the phase-shifted signal group; and a combiner to generate the frequency-multiplied signal based on a combination of outputs of the plurality of multiplier arrays.

3. The apparatus of claim 2 comprising a plurality of switches, controllable according to phase-select bit information in the digital control input, to selectively provide the plurality of phase-shifted signals of the phase-shifted signal group to the plurality of multiplier arrays.

4. The apparatus of claim 2, wherein gains of the plurality of multiplier arrays are controllable according to gain-control bit information in the digital control input.

5. The apparatus of claim 2, wherein the plurality of multiplier arrays comprises a plurality of pairs of differential multiplier arrays, wherein a pair of differential multiplier arrays of the plurality of pairs of differential multiplier arrays is configured to be applied to a pair of phase-shifted signals in the phase-shifted signal group.

6. The apparatus of claim 2, wherein a multiplier of the plurality of multipliers comprises a cascade switched-capacitor Power Amplifier (PA) cell.

7. The apparatus of claim 2, wherein a multiplier of the plurality of multipliers comprises a tri-state Power Amplifier (PA).

8. The apparatus of claim 2, wherein the multiplier array comprises a unit multiplier array comprising a plurality of unit multipliers.

9. The apparatus of claim 1, wherein the phase generator is configured to generate a plurality of first phase-shifted signals by applying the plurality of first phase-shifts to the input frequency signal, and to generate the plurality of phase-shifted signal groups by applying the plurality of second phase-shifts to the plurality of first phase-shifted signals.

10. The apparatus of claim 1 comprising a controller configured to generate the digital control input based on the input frequency and the output frequency.

11. The apparatus of claim 10, wherein the controller is configured to set the digital control input based on a setting of the output frequency.

12. The apparatus of claim 1, wherein the output frequency comprises the input frequency multiplied by a frequency-multiplication factor, wherein the frequency-multiplication factor is based on a product of a count of the plurality of first phase-shifts and the count of the plurality of second phase-shifts.

13. The apparatus of claim 12, wherein the frequency-multiplication factor is an-integer value.

14. The apparatus of claim 12, wherein the frequency-multiplication factor is a non-integer value.

15. The apparatus of claim 1, wherein the input frequency is at least 1 gigahertz (GHz).

16. The apparatus of claim 1, wherein the plurality of first phase-shifts comprises a plurality of coarse phase-shifts, and the plurality of second phase-shifts comprises a plurality of fine phase-shifts.

17. The apparatus of claim 1 comprising a Local Oscillator (LO) signal generator to generate the input frequency signal, and a frequency mixer driven by the output frequency signal.

18. The apparatus of claim 1 comprising a digital Power Amplifier (PA) to transmit a Radio Frequency (RF) signal via an antenna, the digital PA comprising the digitally-controlled frequency multiplier to generate the output frequency signal comprising the RF signal based on the input frequency signal comprising a phase-modulated Local Oscillator (LO) signal.

19. A device comprising:

a frequency generator configured to generate a first frequency signal having a first frequency;

a digitally-controlled frequency multiplier, controllable according to a digital control input, the digitally-controlled frequency multiplier configured to generate a second frequency signal having a second frequency, the digitally-controlled frequency multiplier configured to generate the second frequency signal by multiplying the first frequency of the first frequency signal, the digitally-controlled frequency multiplier comprising:

a phase generator configured to generate a plurality of phase-shifted signal groups corresponding to a respective plurality of first phase-shifts applied to the first frequency signal, wherein a phase-shifted signal group corresponding to a first phase-shift of the plurality of first phase-shifts comprises a plurality of phase-shifted signals based on a respective plurality of second phase-shifts;

a plurality of Digital Clock Multipliers (DCMs) controllable according to the digital control input to generate a respective plurality of frequency-multiplied signals based on the plurality of phase-shifted signal groups, wherein a frequency of the frequency-multiplied signals is based on a product of the first frequency and a count of the plurality of second phase-shifts; and a combiner to generate the second frequency signal based on a combination of the plurality of frequency-multiplied signals; and a Radio Frequency (RF) chain configured to process an RF signal based on the second frequency signal.

20. The device of claim 19, wherein a DCM of the plurality of DCMs is configured to generate a frequency-multiplied signal based on the phase-shifted signal group, the DCM comprising:

a plurality of multiplier arrays corresponding to the plurality of phase-shifted signals in the phase-shifted signal group, wherein a multiplier array comprises a plurality of multipliers to be applied to a phase-shifted signal in the phase-shifted signal group; and a combiner to generate the frequency-multiplied signal based on a combination of outputs of the plurality of multiplier arrays.

21. The device of claim 19, wherein the phase generator is configured to generate a plurality of first phase-shifted signals by applying the plurality of first phase-shifts to the first frequency signal, and to generate the plurality of phase-shifted signal groups by applying the plurality of second phase-shifts to the plurality of first phase-shifted signals.

22. The device of claim 19 comprising a wireless communication device, the wireless communication device comprising a processor to process wireless communication signals communicated by the RF chain.

23. The device of claim 19 comprising a radar device, the radar device comprising a processor to generate radar information based on radar signals communicated by the RF chain.

24. A method of generating an output frequency signal having an output frequency by multiplying an input frequency of an input frequency signal, the method comprising:

generating a plurality of phase-shifted signal groups corresponding to a respective plurality of first phase-shifts applied to the input frequency signal, wherein a phase-shifted signal group corresponding to a first phase-shift of the plurality of first phase-shifts comprises a plurality of phase-shifted signals based on a respective plurality of second phase-shifts;

generating a plurality of frequency-multiplied signals based on the plurality of phase-shifted signal groups, respectively, wherein a frequency of the frequency-multiplied signals is based on a product of the input frequency and a count of the plurality of second phase-shifts; and generating the output frequency signal based on a combination of the plurality of frequency-multiplied signals.

25. The method of claim 24 comprising generating a frequency-multiplied signal based on the phase-shifted signal group by:

applying a plurality of multiplier arrays to the plurality of phase-shifted signals in the phase-shifted signal group, wherein a multiplier array comprises a plurality of multipliers to be applied to a phase-shifted signal in the phase-shifted signal group; and generating the frequency-multiplied signal based on a combination of outputs of the plurality of multiplier arrays.

* * * * *